(12) United States Patent
Hsieh

(10) Patent No.: US 12,266,726 B2
(45) Date of Patent: Apr. 1, 2025

(54) SHIELDED GATE TRENCH MOSFETS WITH IMPROVED PERFORMANCE STRUCTURES

(71) Applicant: Nami MOS CO., LTD., New Taipei (TW)

(72) Inventor: Fu-Yuan Hsieh, New Taipei (TW)

(73) Assignee: NAMI MOS CO., LTD., New Taipei (TW)

(*) Notice: Subject to any disclaimer, the term of this patent is extended or adjusted under 35 U.S.C. 154(b) by 455 days.

(21) Appl. No.: 17/715,089

(22) Filed: Apr. 7, 2022

(65) Prior Publication Data

US 2023/0327013 A1  Oct. 12, 2023

(51) Int. Cl.
*H01L 29/78* (2006.01)
*H01L 29/06* (2006.01)
*H01L 29/10* (2006.01)
*H01L 29/40* (2006.01)

(52) U.S. Cl.
CPC ........ *H01L 29/7813* (2013.01); *H01L 29/063* (2013.01); *H01L 29/0638* (2013.01); *H01L 29/1095* (2013.01); *H01L 29/407* (2013.01); *H01L 29/408* (2013.01); *H01L 29/7811* (2013.01)

(58) Field of Classification Search
CPC ............... H01L 29/7813; H01L 29/063; H01L 29/0638; H01L 29/1095; H01L 29/407; H01L 29/408; H01L 29/7811; H01L 29/41; H01L 29/42376; H01L 29/0619; H01L 29/41766; H01L 29/0878; H01L 29/0623
See application file for complete search history.

(56) References Cited

U.S. PATENT DOCUMENTS 5,998,833 A    12/1999 Baliga
2012/0061754 A1*  3/2012 Hsieh ............... H01L 29/407
                                                438/270

* cited by examiner

*Primary Examiner* — Mohammad A Rahman
(74) *Attorney, Agent, or Firm* — BACON & THOMAS, PLLC

(57) ABSTRACT

The present invention introduces a new shielded gate trench MOSFETs with improved specific on-resistance and avalanche capability structures including an active area and an edge termination area, wherein an epitaxial layer having special multiple stepped epitaxial (MSE) layers in an oxide charge balance (OCB) region, and an edge termination having multiple trench field plates, and electric field reducing regions disposed surrounding bottom of gate trenches with a doping concentration lower than said bottom epitaxial layer of the MSE layers. Moreover, in some preferred embodiment, a multiple stepped oxide structure in the OCB region, and an epitaxial layer in a buffer region below the OCB region with a doping concentration lower than the MSE layers is introduced to further reduce the specific on-resistance and enhance device ruggedness.

20 Claims, 27 Drawing Sheets

SHIELDED GATE TRENCH MOSFETS WITH IMPROVED PERFORMANCE STRUCTURES

FIELD OF THE INVENTION

This invention relates generally to semiconductor power devices, and more particularly, to a shielded gate trench (SGT) MOSFET (Metal Oxide Semiconductor Field Effect Transistor) having multiple stepped epitaxial (MSE) structure, multiple edge trenches in a termination area and electric field reducing regions surrounding bottoms of gate trenches to improve the device performance.

BACKGROUND OF THE INVENTION

FIG. 1A shows a novel SGT MOSFET disclosed by Baliga in U.S. Pat. No. 5,998,833 which has a graded doped (GD) epitaxial layer with a doping concentration linearly increasing from a body region 116 to a substrate 114 along a gate trench 120*a*. The device has much lower gate charge and superior specific on-resistance compared with a traditional SGT MOSFET with a uniform doped epitaxial layer. The patent also disclosed an improved edge termination with a single trench field plate structure as shown in FIG. 1B. However, it is difficult to grow an epitaxial layer with the linearly graded doping profile in manufacturing.

Therefore, there is a need to provide new device configurations such that above discussed problem and limitation can be resolved, and DC/AC performance and device ruggedness are further improved.

SUMMARY OF THE INVENTION

The present invention provides a new SGT MOSFET including an active area and an edge termination area, wherein the epitaxial layer having special multiple stepped epitaxial (MSE) layers in an oxide charge balance (OCB) region and the edge termination having multiple trench field plates, and electric field reducing regions disposed surrounding bottom of gate trenches with a doping concentration lower than the bottom epitaxial layer of the MSE layers. With this novel MSE structure, specific on-resistance is significantly reduced as a result of higher doping concentration in drift region at any desired breakdown voltage (BV) than the conventional SGT and the prior art SGT MOSFETs. Moreover, the present invention is manufacturable in mass production with good process window.

The specific on-resistance can be further reduced with combination of the MSE structure and a multiple stepped oxide (MSO) structure in the OCB region, and an epitaxial layer in a buffer region between a substrate and the OCB region with a doping concentration lower than the MSE layers. The MSO structure is a field plate oxide surrounding a shielded gate electrode in a gate trench having multiple stepped oxide structure with varying thickness decreasing stepwise in a direction from a bottom of the gate trench to a body region, wherein each stepped oxide is uniform.

According to one aspect, the invention features a SGT MOSFET which is formed in an epitaxial layer of a first conductivity type onto a substrate of the first conductivity type, the SGT MOSFET further comprising: a plurality of gate trenches formed in an active area, surrounded by source regions of the first conductivity type are encompassed in body regions of a second conductivity type near a top surface of the epitaxial layer, each of the gate trenches is filled with a gate electrode and a shielded gate electrode; the shielded gate electrode is insulated from the epitaxial layer by a first insulating film, the gate electrode is insulated from the epitaxial layer by a gate oxide, the shielded gate electrode and the gate electrode are insulated from each other by an (Inter-Poly Oxide) IPO film, the gate oxide surrounds the gate electrode and has less thickness than the first insulating film; the body regions, the shielded gate electrode and the source regions are shorted together to a source metal through a plurality of trench contacts; and the epitaxial layer has the MSE layers with different doping concentrations decreasing stepwise in a direction from substrate to the body regions, wherein each of the MSE layers has a uniform doping concentration as grown; and the SGT MOSFET further comprising: an edge termination area having multiple edge trenches, wherein the source regions and the body regions in the active area are not disposed between two adjacent of the edge trenches; a trench field plate is disposed in each of edge trenches and insulated from the epitaxial layer by a second insulating film, wherein each of the edge trenches has a trench width and a trench depth greater than or equal to each of the gate trenches in the active area.

According to another aspect, in some preferred embodiments, the gate electrode is disposed above the shielded gate electrode. In some other preferred embodiments, the shielded electrode is disposed in the middle and the gate electrode is disposed surrounding upper portion of the shielded electrode.

According to another aspect, in some preferred embodiments, the edge termination area further comprising at least one edge body region of the second conductivity type disposed between a channel stop region and the multiple edge trenches having a floating voltage.

According to another aspect, in some preferred embodiments, the MSE layers comprise at least two stepped epitaxial layers of different doping concentrations including a bottom epitaxial layer with a doping concentration D1 and a top epitaxial layer above the bottom epitaxial layer with a doping concentration D2, wherein D2<D1. In some other preferred embodiments, the MSE layers comprise at least three stepped epitaxial layers of different doping concentrations including a bottom epitaxial layer with a doping concentration D1, a middle epitaxial layer with a doping concentration D2 and a top epitaxial layer with a doping concentration D3, wherein D3<D2<D1.

According to another aspect, the present invention also features a SGT MOFET which is formed in an epitaxial layer of a first conductivity type onto a substrate of the first conductivity type, the SGT MOSFET further comprising: a plurality of gate trenches formed in an active area, surrounded by source regions of the first conductivity type are encompassed in body regions of a second conductivity type near a top surface of the epitaxial layer, each of the gate trenches is filled with a gate electrode and a shielded gate electrode; the shielded gate electrode is insulated from the epitaxial layer by a first insulating film, the gate electrode is insulated from the epitaxial layer by a gate oxide, the shielded gate electrode and the gate electrode are insulated from each other by an IPO film, the gate oxide surrounds the gate electrode and has less thickness than the first insulating film; an Oxide Charge Balance (OCB) region is formed between two adjacent of the gate trenches below the body regions and above bottoms of the gate trenches; a buffer region is formed between the substrate and a bottom of the shielded gate electrode; the body regions, the shielded gate electrode and the source regions are shorted together to a source metal through a plurality of trench contacts; the epitaxial layer in the OCB region has MSE layers with different doping concentrations decreasing stepwise in a direction from a bottom of the shielded gate electrode to the body regions along sidewalls of the gate trenches, wherein each of the MSE layers has a uniform doping concentration as grown; the epitaxial layer in the buffer region has an epitaxial layer with a doping concentration equal to or lower than the bottom epitaxial layer of the MSE layers in the OCB region; and the SGT MOSFET further comprising: an edge termination area having multiple edge trenches wherein the source regions and the body regions in the active area are not disposed between two adjacent of the edge trenches; a trench field plate is disposed in each of edge trenches and insulated from the epitaxial layer by a second insulating film, wherein each of the edge trenches has a trench width and a trench depth greater than or equal to each of the gate trenches in the active area; Since the first insulating film and the second insulating film usually have a thinner insulating film thickness on bottoms of the gate trenches and edge trenches than along sidewalls, an N type electric field reducing region is disposed surrounding each bottom of the gate trenches in the active area and edge trenches in the termination area, wherein the doping concentration of the electric field reducing region is lower than that of the epitaxial layer in the buffer region to prevent early avalanche breakdown from happening at bottoms of the gate trenches and the edge trenches.

According to another aspect, in some preferred embodiments, a P type electric field reducing region is disposed surrounding each bottom of the edge trenches in the termination area while the N type electric field reducing region is disposed surrounding each bottom of the gate trenches in the active area to further avoid avalanche breakdown occurring in the termination area for avalanche capability enhancement.

According to another aspect, in some preferred embodiments, the gate electrode is disposed above the shielded gate electrode. In some other preferred embodiments, the shielded electrode is disposed in the middle and the gate electrode is disposed surrounding upper portion of the shielded electrode.

According to another aspect, in some preferred embodiments, the edge termination area further comprising at least one edge body region of the second conductivity type having a floating voltage.

According to another aspect, in some preferred embodiments, the epitaxial layer in the OCB region comprises at least three stepped epitaxial layers of different doping concentrations including a first epitaxial layer above the buffer epitaxial layer with a doping concentration D1, a second epitaxial layer above the first epitaxial layer with a doping concentration D2 and a top epitaxial layer above the second epitaxial layer with a doping concentration D3, wherein D3<D2<D1.

According to another aspect, in some preferred embodiments, the first insulating film is a single oxide film having a uniform thickness. In some other preferred embodiments, the first insulating film has a multiple stepped oxide (MSO) structure with thickness decreasing stepwise in a direction from bottoms of the gate trenches to the body regions along sidewalls of the gate trenches.

According to another aspect, in some preferred embodiments, the epitaxial layer in the source regions and the body regions has a doping concentration same as a top epitaxial layer of the MSE layers in the OCB region. In some other preferred embodiments, the epitaxial layer in the source regions and the body regions has a doping concentration higher than a top epitaxial layer of the MSE layers in the OCB region.

According to another aspect, in some preferred embodiments, a mesa width between two adjacent of the gate trenches is equal to or larger than that between two adjacent of the edge trenches.

According to another aspect, the present invention also features a SGT MOFET which is formed in an epitaxial layer of a first conductivity type onto a substrate of the first conductivity type, the SGT MOSFET further comprising: a plurality of gate trenches formed in an active area, surrounded by source regions of the first conductivity type are encompassed in body regions of a second conductivity type near a top surface of the epitaxial layer, each of the gate trenches is filled with a gate electrode and a shielded gate electrode; the shielded gate electrode is insulated from the epitaxial layer by a first insulating film, the gate electrode is insulated from the epitaxial layer by a gate oxide, the shielded gate electrode and the gate electrode are insulated from each other by an IPO film, the gate oxide surrounds the gate electrode and has less thickness than the first insulating film; an OCB region is formed between two adjacent of the gate trenches below the body regions and a bottom of the shielded gate electrode; a BUFFER region is formed between the substrate and the OCB region; the body regions, the shielded gate electrode and the source regions are shorted together to a source metal through a plurality of trench contacts; the epitaxial layer has two epitaxial layers, a first epitaxial layer is disposed in the buffer region and a second epitaxial layer is disposed above the first epitaxial layer wherein doping concentration of the first epitaxial layer is lower than that of the second epitaxial layer; the first insulating film has a multiple stepped oxide (MSO) structure with different thicknesses decreasing stepwise in a direction from the bottoms of the gate trenches to the body regions along sidewalls of the gate trenches; and the SGT MOSFET further comprising an edge termination area having multiple edge trenches wherein the source regions and the body regions in the active area are not disposed between two adjacent of the edge trenches; a trench field plate is disposed in each of the edge trenches and insulated from the epitaxial layer by a second insulating film, wherein each of the edge trenches has a trench width and a trench depth greater than or equal to each of the gate trenches in the active area.

These and other objects and advantages of the present invention will no doubt become more obvious to those of ordinary skill in the art after having read the following detailed description of the preferred embodiment, which is illustrated in the various drawing figures.

BRIEF DESCRIPTION OF THE DRAWINGS

The accompanying drawings, which are included to provide a further understanding of the invention and are incorporated in and constitute a part of this specification, illustrate exemplary embodiments of the invention and together with the description to explain the principles of the invention. In the drawings.

DETAILED DESCRIPTION OF THE EMBODIMENTS

In the following Detailed Description, reference is made to the accompanying drawings, which forms a part thereof, and in which is shown by way of illustration specific embodiments in which the invention may be practiced. In this regard, directional terminology, such as "top", "bottom", "front", "back", etc., is used with reference to the orientation of the Figure(s) being described. Because components of embodiments can be positioned in a number of different orientations, the directional terminology is used for purpose of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims. It is to be understood that the features of the various exemplary embodiments described herein may be combined with each other, unless specifically noted otherwise.

Figure 1A:
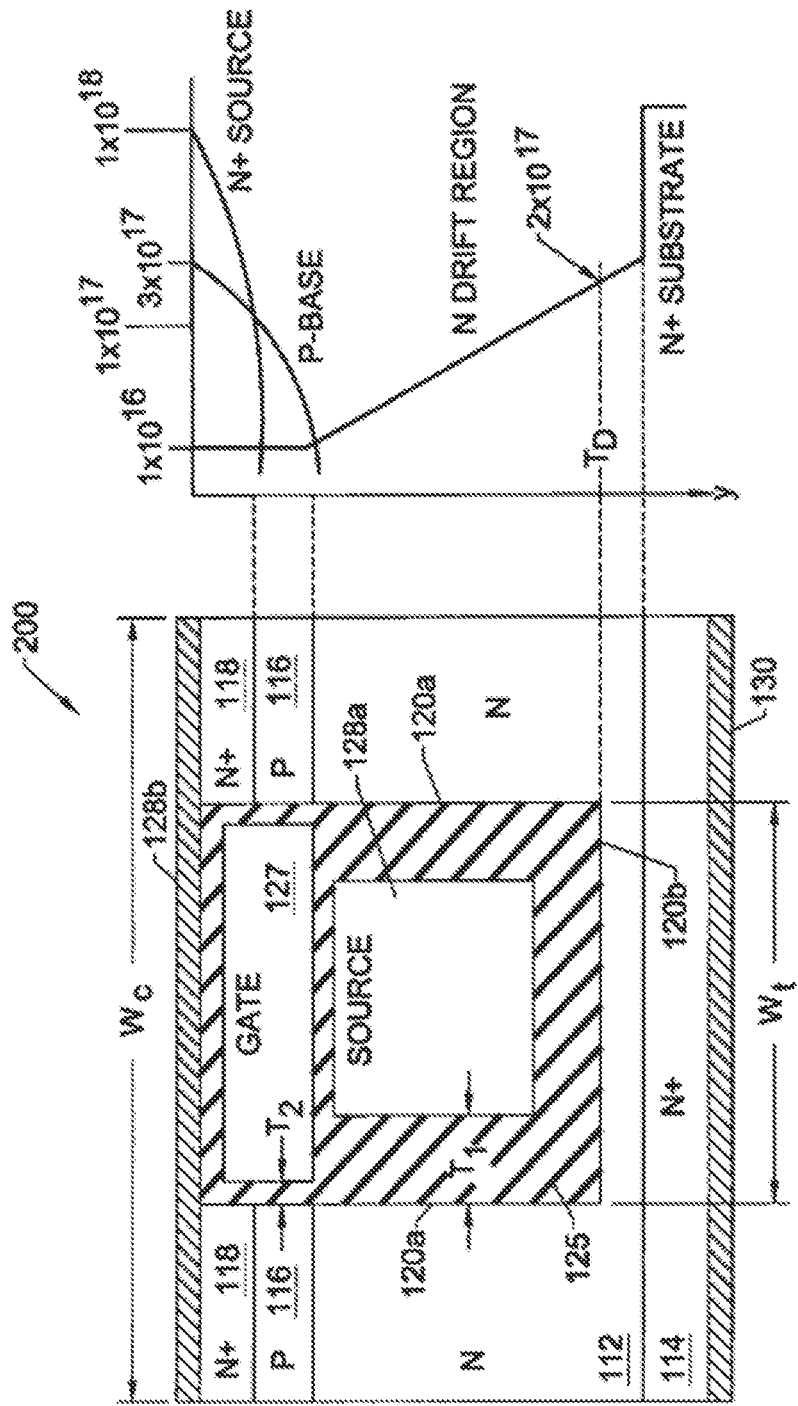
FIG. 1A is a cross-sectional view of an SGT MOSFET of prior art and doping profile therein.
Figure 1B:
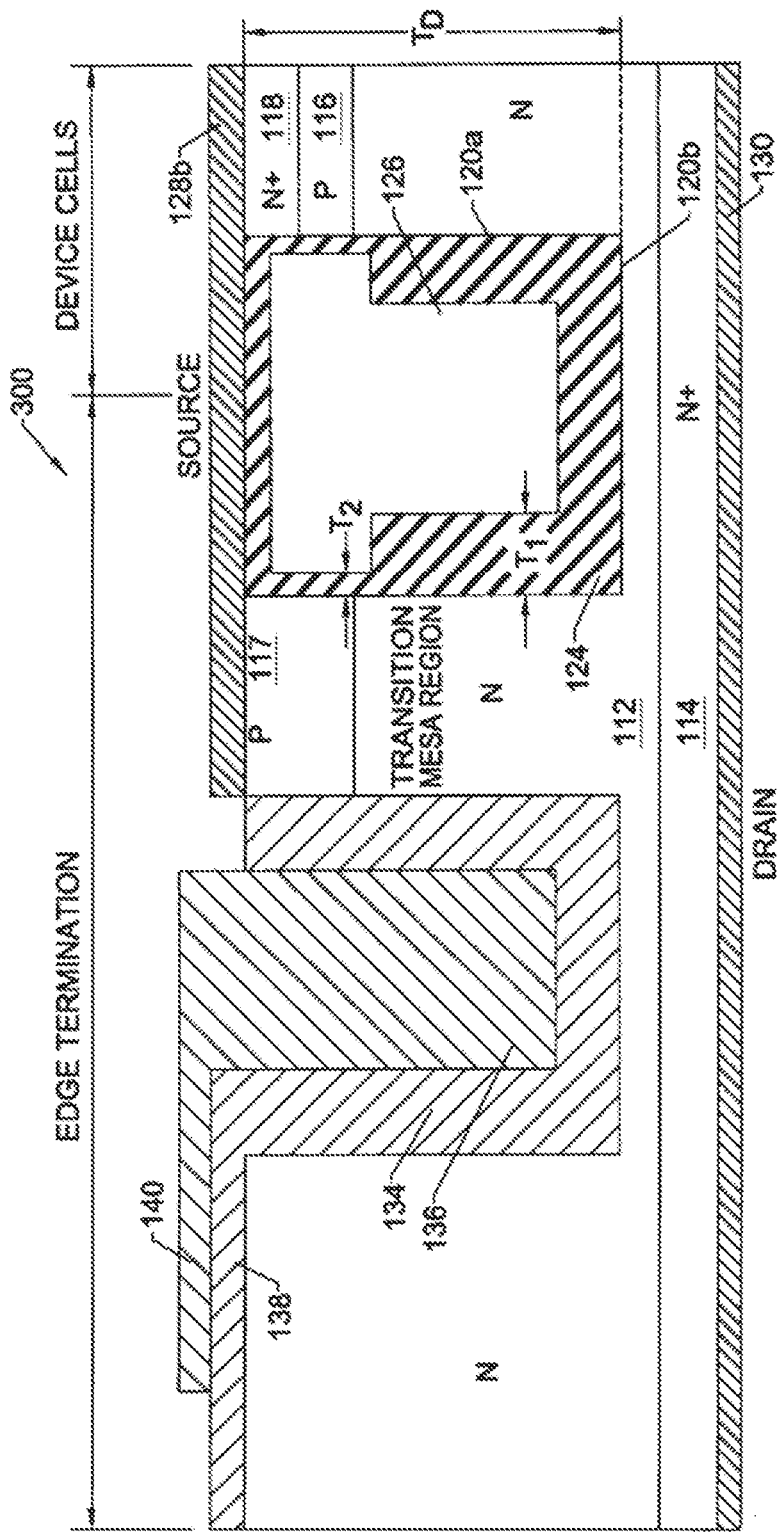
FIG. 1B is a cross-sectional view of edge termination of the prior art.
Figure 2A:
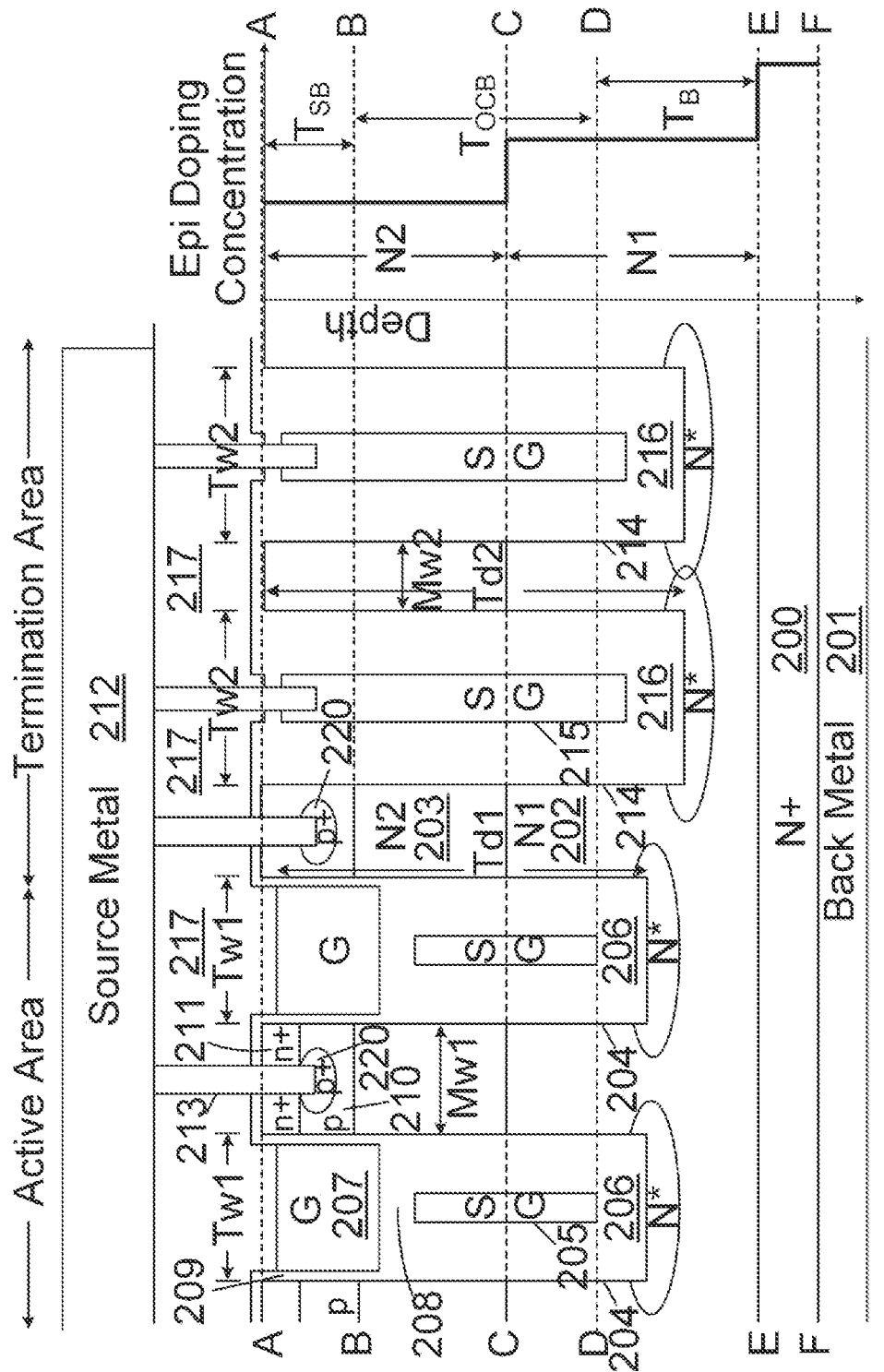
FIG. 2A is a cross-sectional view of a preferred embodiment wherein the doping concentration variations are depicted along the vertical direction according to the present invention.

Please refer to FIG. 2A for a preferred embodiment of this invention with new and improved device structure having two stepped epitaxial layers wherein the doping concentration variations as grown are depicted along the vertical direction. The device comprises an N-channel SGT MOSFET formed in an N type epitaxial layer onto an N+ substrate 200 coated with a back metal 201 of Ti/Ni/Ag on rear side as a drain metal. An OCB region $T_{OCB}$ is formed between two adjacent of gate trenches 204 below the body regions 210 and above a bottom of the shielded gate electrode 205 (between B-B and D-D lines), and a buffer region $T_B$ is formed between the N+ substrate 200 and a bottom of the shielded gate electrode 205 (between D-D and E-E Lines). The N type epitaxial layer comprises a bottom $1^{st}$ epitaxial layer (N1, as illustrated between C-C and E-E lines) 202 with a doping concentration D1 and a top $2^{nd}$ Z epitaxial layer (N2, as illustrated between A-A and C-C lines) 203 above the bottom $1^{st}$ epitaxial layer 202 with a doping concentration D2, wherein D2<D1, to increase the breakdown voltage and lower the specific on-resistance. The bottom $1^{st}$ epitaxial layer 202 is disposed on the N+ substrate 200 and extends above the buffer region $T_B$. The epitaxial layer in the buffer region has a doping concentration same as the doping concentration D1 of the bottom $1^{st}$ epitaxial layer 202. Inside the N type epitaxial layer, a plurality of gate trenches 204 in the active area and edge trenches 214 in the termination area are formed extending from a top surface of the top $2^{nd}$ epitaxial layer 203 and vertically downward into the bottom $1^{st}$ epitaxial layer 202, wherein trench bottoms of the gate trenches 204 and edge trenches 214 are above a common interface between the N+ substrate 200 and the bottom $1^{st}$ epitaxial layer 202. Inside each of the gate trenches 204 in the active area, a shielded gate electrode (SG, as illustrated) 205 is disposed in the lower portion and a single gate electrode (G, as illustrated) 207 is disposed in the upper portion above the shielded gate electrode 205. The shielded gate electrode 205 is insulated from the adjacent epitaxial layer by a first insulating film 206, and the gate electrodes 207 is insulated from the adjacent epitaxial layer by a gate oxide 209, wherein the gate oxide 209 has a thinner thickness than the first insulating film 206 which has a uniform thickness along trench sidewalls, meanwhile, the shielded gate electrode 205 and the gate electrode 207 is insulated from each other by an IPO film 208. Between every two adjacent gate trenches 204, the P body regions 210 with n+ source regions 211 thereon are extending near top surface of the top $2^{nd}$ epitaxial layer 203 to form source regions and body regions $T_{SB}$ between A-A and B-B lines. The P body regions 210, the n+ source regions 211 and the shielded gate electrodes 205 are further shorted together to a source metal 212 through a plurality of trenched contacts 213 filled with contact plugs and barriers implemented by penetrating through a contact insulating layer 217 and surrounded by p+ heavily doped regions 220 around bottoms underneath the n+ source regions 211. In the top $2^{nd}$ epitaxial layer 203, outside the edge of the active area including the termination area, a p+ body contact doped region 220 is formed surrounding at least bottom of the trenched source-body contact 213 without n+ source region 211. The source regions 211 and the body regions in the active area are not disposed between two adjacent of the edge trenches 214 in the termination area. Inside each of the edge trenches 214, a trench field plate 215 is disposed and insulated from the adjacent epitaxial layer by a second insulating film 216, wherein the trench width Tw2 of the edge trench 214 is greater than or equal to the trench width Tw1 of the gate trench 204 in the active area (Tw2≥Tw1), and the trench depth Td2 of the edge trench 214 is greater than or equal to the trench depth Td1 of the gate trench 204 in the active area (Td2≥Td1). The mesa width between two adjacent of the gate trenches 204 is equal to or larger than that between two adjacent of the edge trenches 214 (Tw1≥Mw2). An N type electric field reducing region N* with a doping concentration D* is disposed surrounding a bottom of each of gate trenches 204 in the active area and edge trenches 214 in the termination area, wherein the doping concentration D* is lower than the doping concentration D1 of the bottom $1^{st}$ epitaxial layer 202. The N type electric reducing region is disposed by ion implantation of P type dopant such as Boron or BF2 through each bottom of the gate trenches 204 and edge trenches 214 after the gate trenches 204 and the edge trenches 214 are formed prior to the first insulating film 206 and the second insulating film 216 filling up bottoms and sidewalls of the gate trenches 204 and the edge trenches 214, respectively. Because the first insulating film 206 and the second insulating film 216 usually have a thinner insulating film thickness on the bottoms of the gate trenches 204 and the edge trenches 214 than along the sidewalls, the electric field reducing region N* is used to reduce electric field around bottoms of the gate trenches 204 and the edge trenches 214 to avoid occurrence of early avalanche breakdown.

Figure 2B:
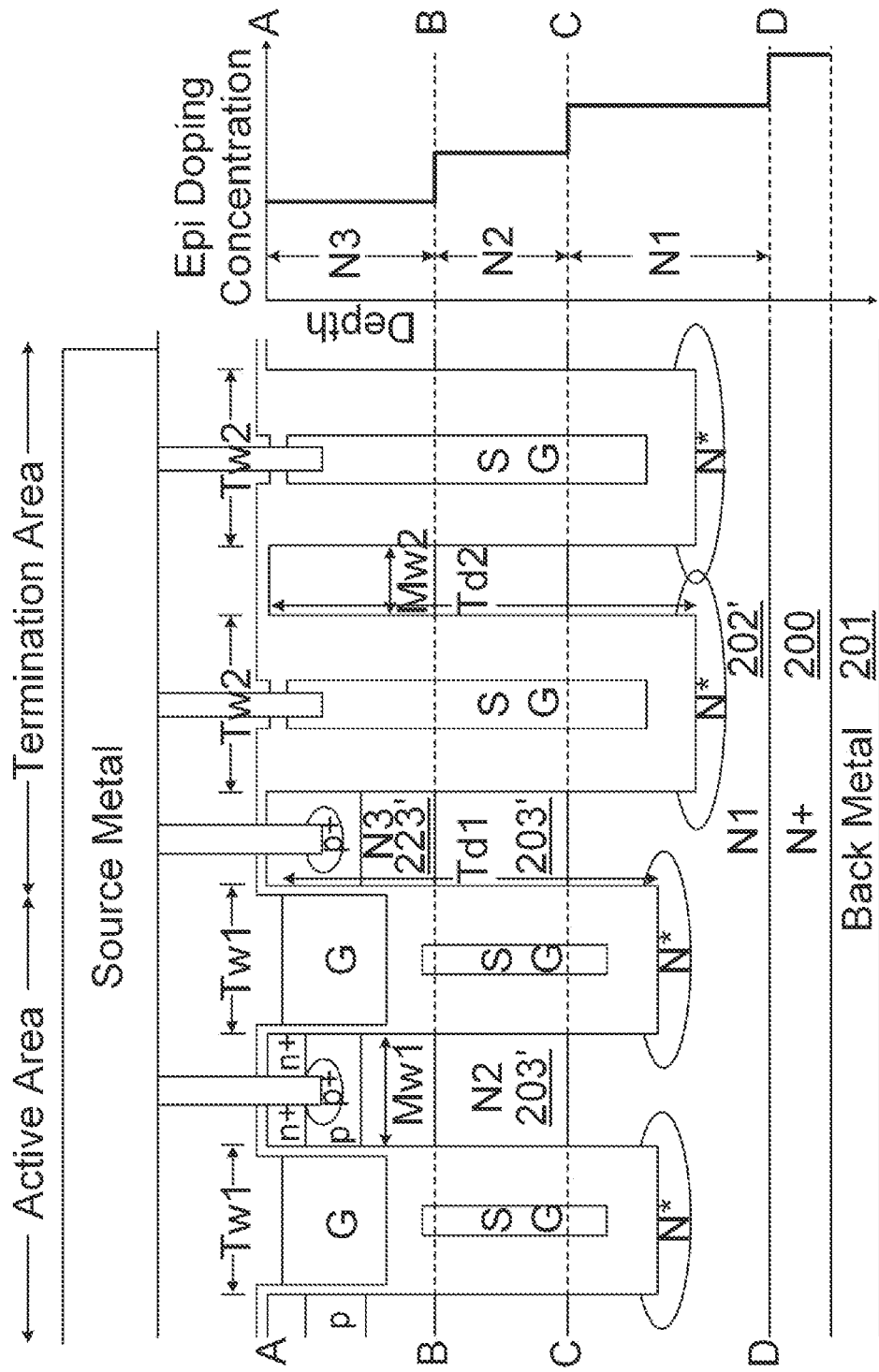
FIG. 2B is a cross-sectional view of another preferred embodiment wherein the doping concentration variations are depicted along the vertical direction according to the present invention.

Please refer to FIG. 2B for another preferred embodiment of the present invention with new and improved device structure having three stepped epitaxial layers wherein the doping concentration variations as grown are depicted along the vertical direction. The N-channel trenched semiconductor power device has a similar structure to FIG. 2A, except that, in FIG. 2B, the N type epitaxial layer comprises three stepped epitaxial layers of different doping concentrations including a bottom $1^{st}$ epitaxial layer (N1, as illustrated) 202' with a doping concentration D1, a middle $2^{nd}$ epitaxial layer (N2, as illustrated) 203' with a doping concentration D2 and a top 3rd epitaxial layer (N3, as illustrated) 223' with a doping concentration D3, wherein D3<D2<D1, to further reduce the specific on-resistance. The D2 can be an average of D1 and D3.

Figure 2C:
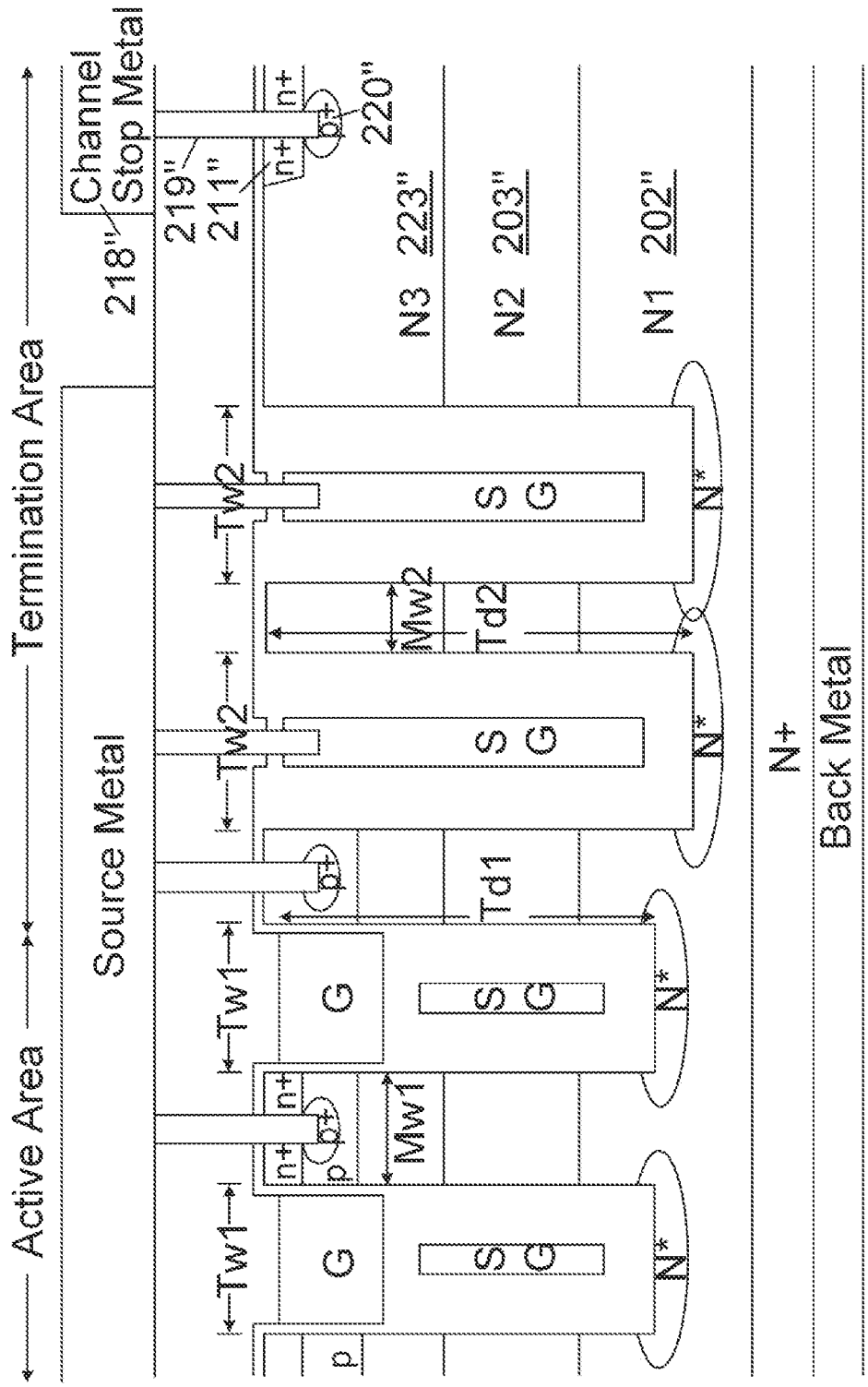
FIG. 2C is a cross-sectional view of another preferred embodiment according to the present invention.

Please refer to FIG. 2C for another preferred embodiment of the present invention with new and improved device structure having three stepped epitaxial layers. The N-channel trenched semiconductor power device has a similar structure to FIG. 2B, except that, in FIG. 2C, in the termination area, a channel stop metal 218" is connected with the n+ source region 211", the top 3rd epitaxial layer (N3, as illustrated) 223", and a p+ body contact doped region 220" through a trenched channel stop contact 219".

Figure 2D:
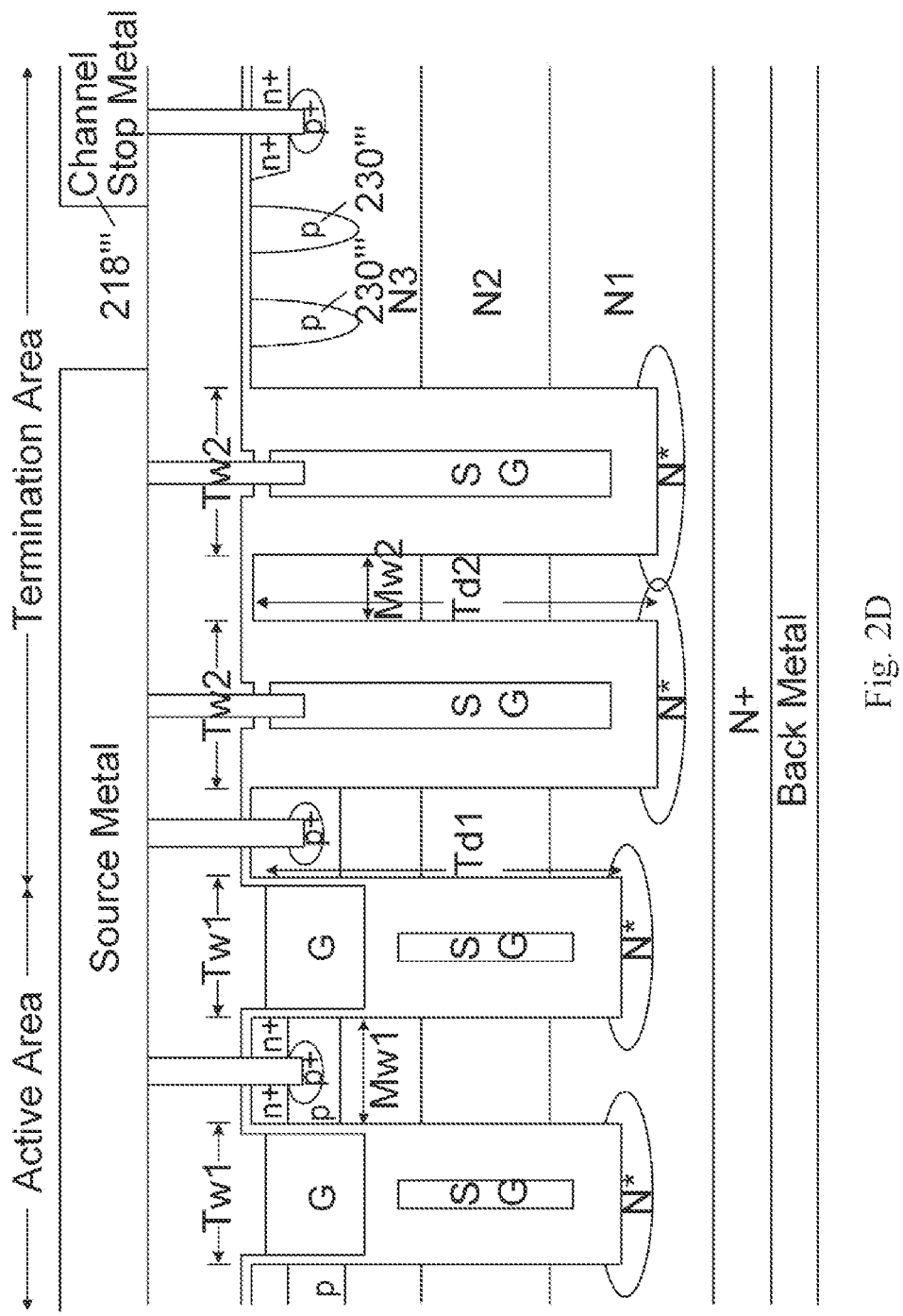
FIG. 2D is a cross-sectional view of another preferred embodiment according to the present invention.

Please refer to FIG. 2D for another preferred embodiment of the present invention with new and improved device structure having three stepped epitaxial layers. The N-channel trenched semiconductor power device has a similar structure to FIG. 2C, except that, in FIG. 2D, the termination area further comprises multiple floating P type edge body regions 230''' having floating voltages and located between the edge trenches and the channel stop metal 218".

Figure 2E:
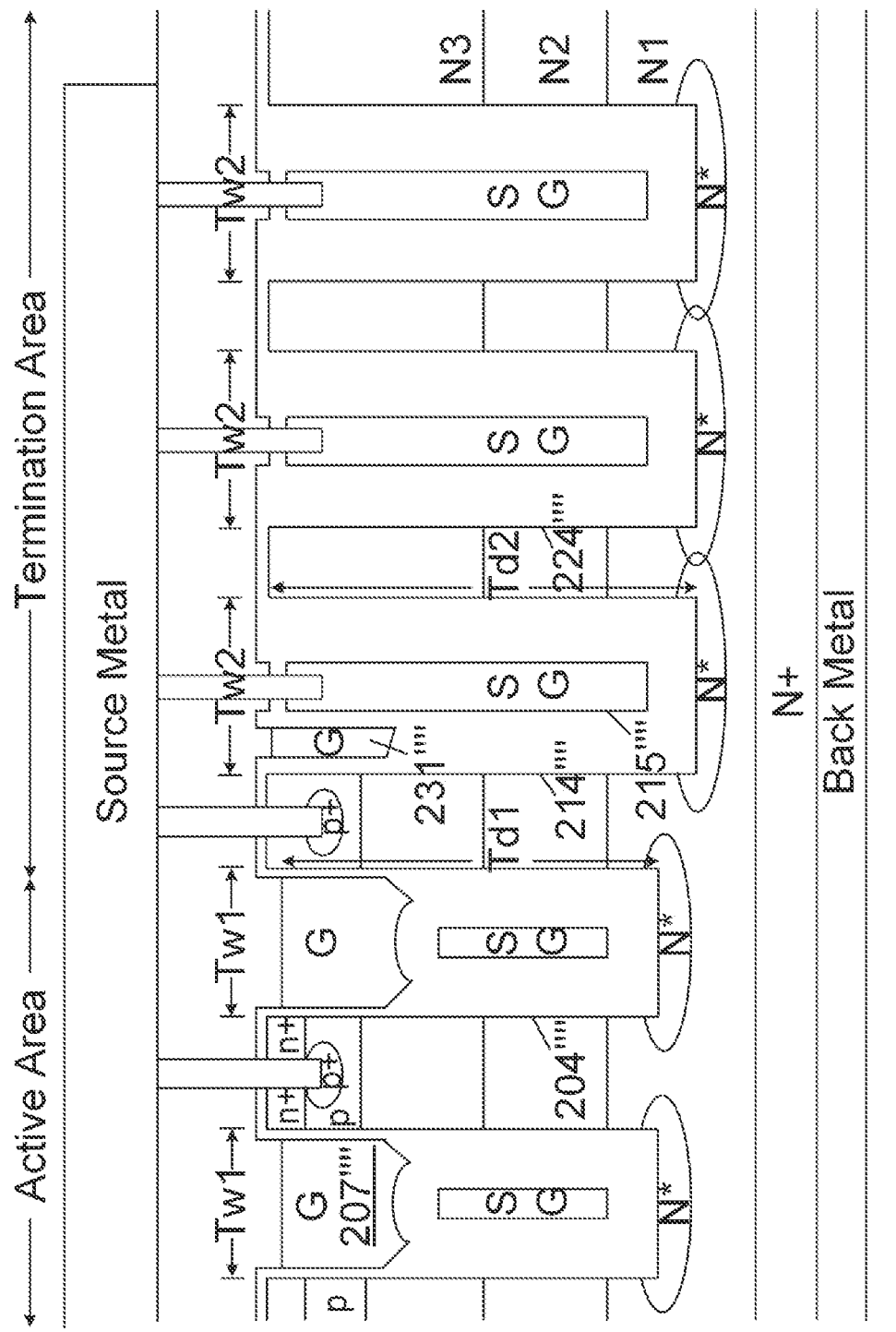
FIG. 2E is a cross-sectional view of another preferred embodiment according to the present invention.

Please refer to FIG. 2E for another preferred embodiment of the present invention with new and improved device structure having three stepped epitaxial layers. The N-channel trenched semiconductor power device has a similar structure to FIG. 2D, except that, in FIG. 2E, shape of a gate electrode 207''' is different due to different process, and moreover, a trench field plate 215''' formed in a first type edge trench 214''' in the termination area is surrounded with a gate electrode 231''' at sidewall of upper portion of the first type edge trench 214''' near the active area while a second type edge trench 224''' adjacent to the first type edge trench 214''' has the same structure as the edge trench in FIG. 2D. The trench width Tw1 of the first type edge trench 214''' is greater than or equal to the trench width Tw2 of the gate trench 204''' in the active area, and the trench depth Td1 of the first type edge trench 214''' is greater than or equal to the trench depth Td2 of the gate trench 204''' in the active area.

Figure 3A:
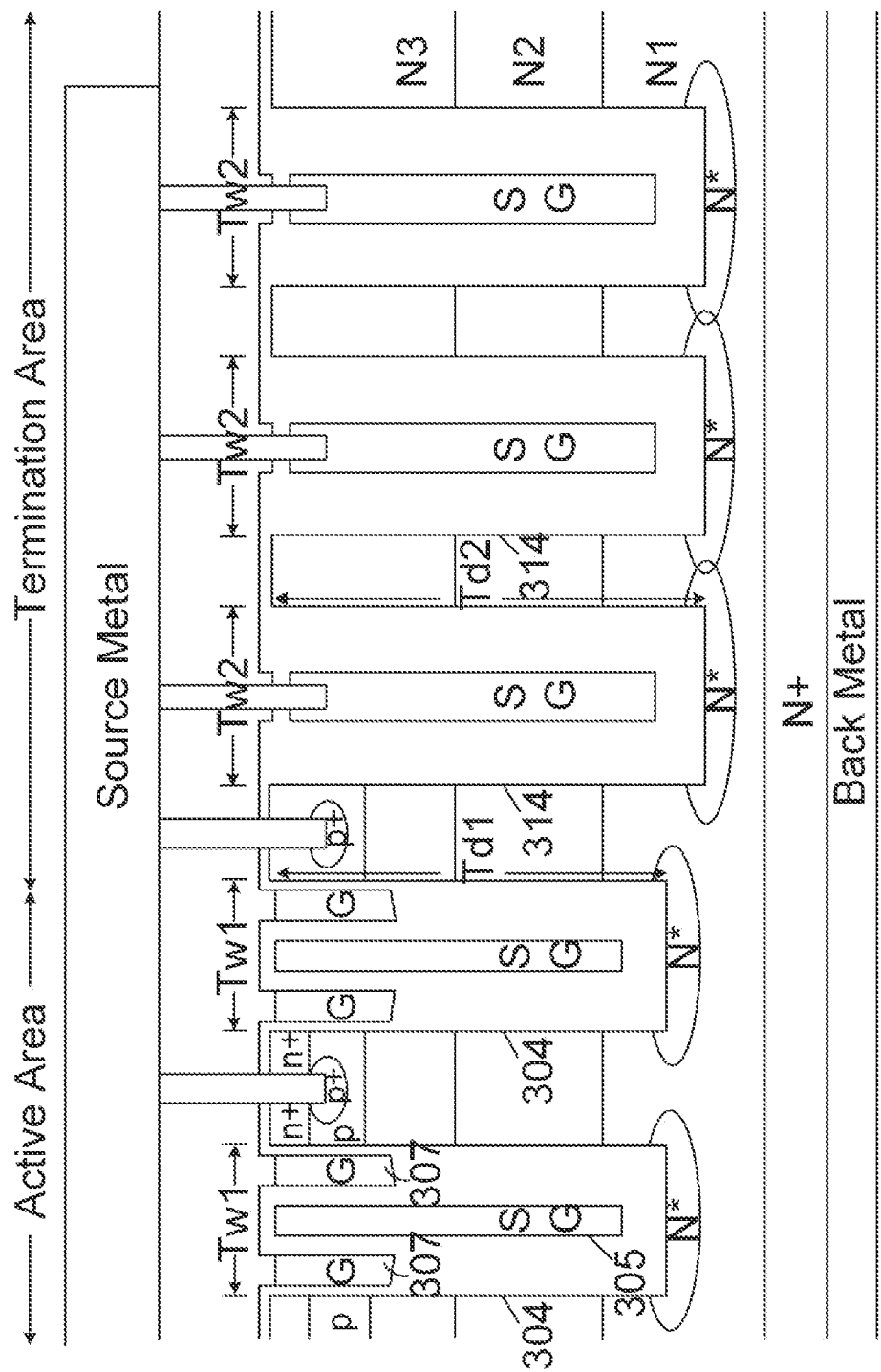
FIG. 3A is a cross-sectional view of another preferred embodiment according to the present invention.

Please refer to FIG. 3A for another preferred embodiment of the present invention with new and improved device structure having three stepped epitaxial layers. The N-channel trenched semiconductor power device has a similar structure to FIG. 2B, except for the different shielded gate structure in the gate trenches 304 in the active area. Inside each of the gate trenches 304, a shielded gate electrode (SG, as illustrated) 305 is disposed in the middle and gate electrode (G, as illustrated) 307 is disposed surrounding upper portions of the shielded electrode 305.

Figure 3B:
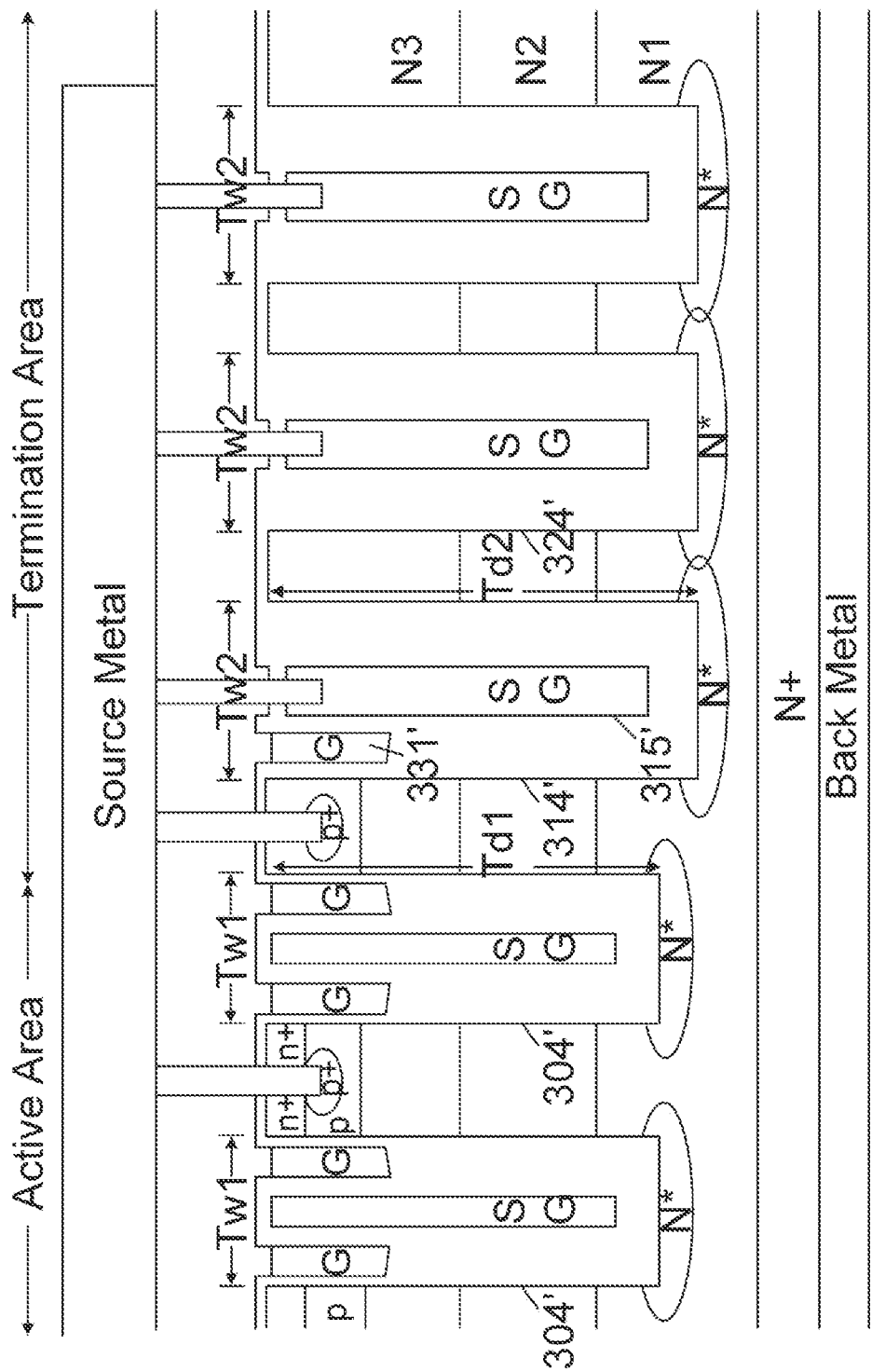
FIG. 3B is a cross-sectional view of another preferred embodiment according to the present invention.

Please refer to FIG. 3B for another preferred embodiment of the present invention with new and improved device structure having three stepped epitaxial layers. The N-channel trenched semiconductor power device has a similar structure to FIG. 3A, except that, in FIG. 3B, the trench field plate 315' formed in the first type edge trench 314' in the termination area is surrounded with a gate electrode 331' at a sidewall of upper portion of the first type edge trench 314' near the active area while a second type edge trench 324' adjacent to the first type edge trench 314' has the same structure as the edge trench in FIG. 3A. The trench width Tw1 of the first type edge trench 314' is greater than or equal to the trench width Tw2 of the gate trench 304' in the active area, and the trench depth Td1 of the first type edge trench 314' is greater than or equal to the trench depth Td2 of the gate trench 304' in the active area.

Figure 4A:
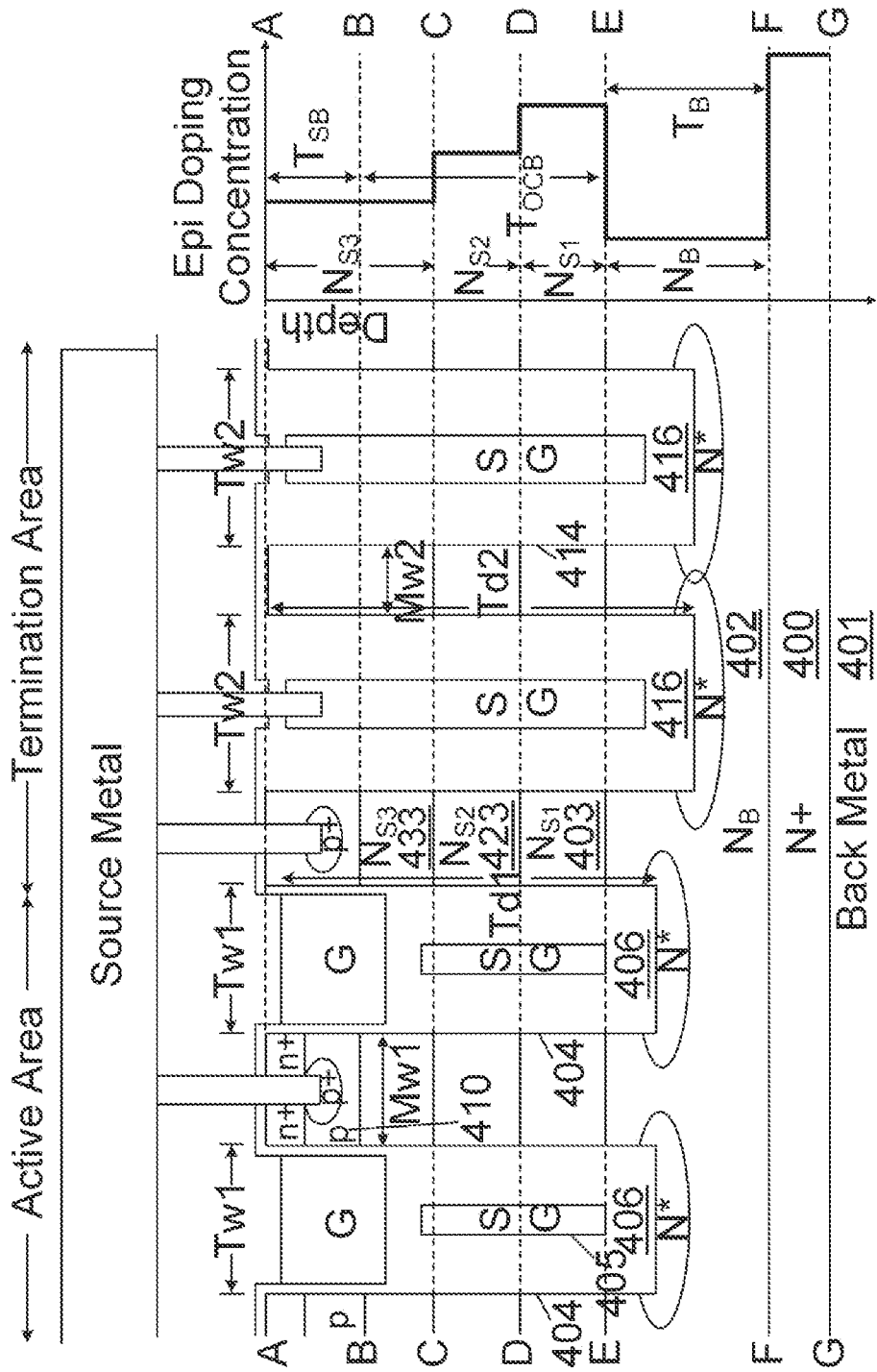
FIG. 4A is a cross-sectional view of another preferred embodiment wherein the doping concentration variations are depicted along the vertical direction according to the present invention.

Please refer to FIG. 4A for another preferred embodiment of the present invention with new and improved device structure having multiple stepped epitaxial layers wherein the doping concentration variations as grown are depicted along the vertical direction. The N-channel trenched semiconductor power device has a similar structure to FIG. 2B, except for the different epitaxial layer structure. In FIG. 4A, an OCB region $T_{OCB}$ is formed between two adjacent of the gate trenches 404 below the body regions 410 and above a bottom of the shielded gate electrode 405 (between B-B and E-E lines), a buffer region $T_B$ is formed between the N+ substrate 400 and a bottom of the shielded gate electrode 405

(between E-E and F-F lines), the epitaxial layer in the OCB region has three stepped epitaxial layers with different doping concentrations including a bottom $1^{st}$ epitaxial layer ($N_{S1}$, as illustrated between D-D and E-E lines) 403 above the buffer epitaxial layer (NB, as illustrated between E-E and F-F lines) 402 with a doping concentration D1, a middle $2^{nd}$ epitaxial layer ($N_{S2}$, as illustrated between C-C and D-D lines) 423 above the $1^{st}$ epitaxial layer 403 with a doping concentration D2 and a top 3rd epitaxial layer ($N_{S3}$, as illustrated between A-A and C-C lines) 433 above the $2^{nd}$ epitaxial layer 423 with a doping concentration D3, wherein D3<D2<D1. The D2 can be an average of D1 and D3. Moreover, the epitaxial layer in the source regions and body regions $T_{SB}$ has a doping concentration same as the top 3rd epitaxial layer 433 of the MSE layers in the OCB region $T_{OCB}$, and the buffer epitaxial layer 402 has a doping concentration $D_B$ lower than each of the MSE layers in the OCB region $T_{OCB}$. The mesa width between two adjacent of the gate trenches 404 is equal to or larger than that between two adjacent of the edge trenches 414 (Mw1≥Mw2). An N type electric field reducing region N* with a doping concentration D* is disposed surrounding each bottom of gate trenches 404 in the active area and edge trenches 414 in the termination area, wherein the doping concentration D* is lower than the doping concentration $D_B$ of the buffer epitaxial layer 402. The N type electric reducing region is disposed by ion implantation of P type dopant such as Boron or BF2 through each bottom of the gate trenches 404 and edge trenches 414 after the gate trenches 404 and edge trenches 414 are formed prior to the first insulating film 406 and the second insulating film 416 filling up bottoms and sidewalls of the gate trenches 404 and edge trenches 414. Because the first insulating film 406 and the second insulating film 416 usually have a thinner insulating film thickness on the bottoms of the gate trenches 404 and edge trenches 414 than along the sidewalls, the electric field reducing region N* is used to reduce electric field around bottoms of the gate trenches 404 and edge trenches 414 to avoid occurrence of early avalanche breakdown.

Figure 4B:
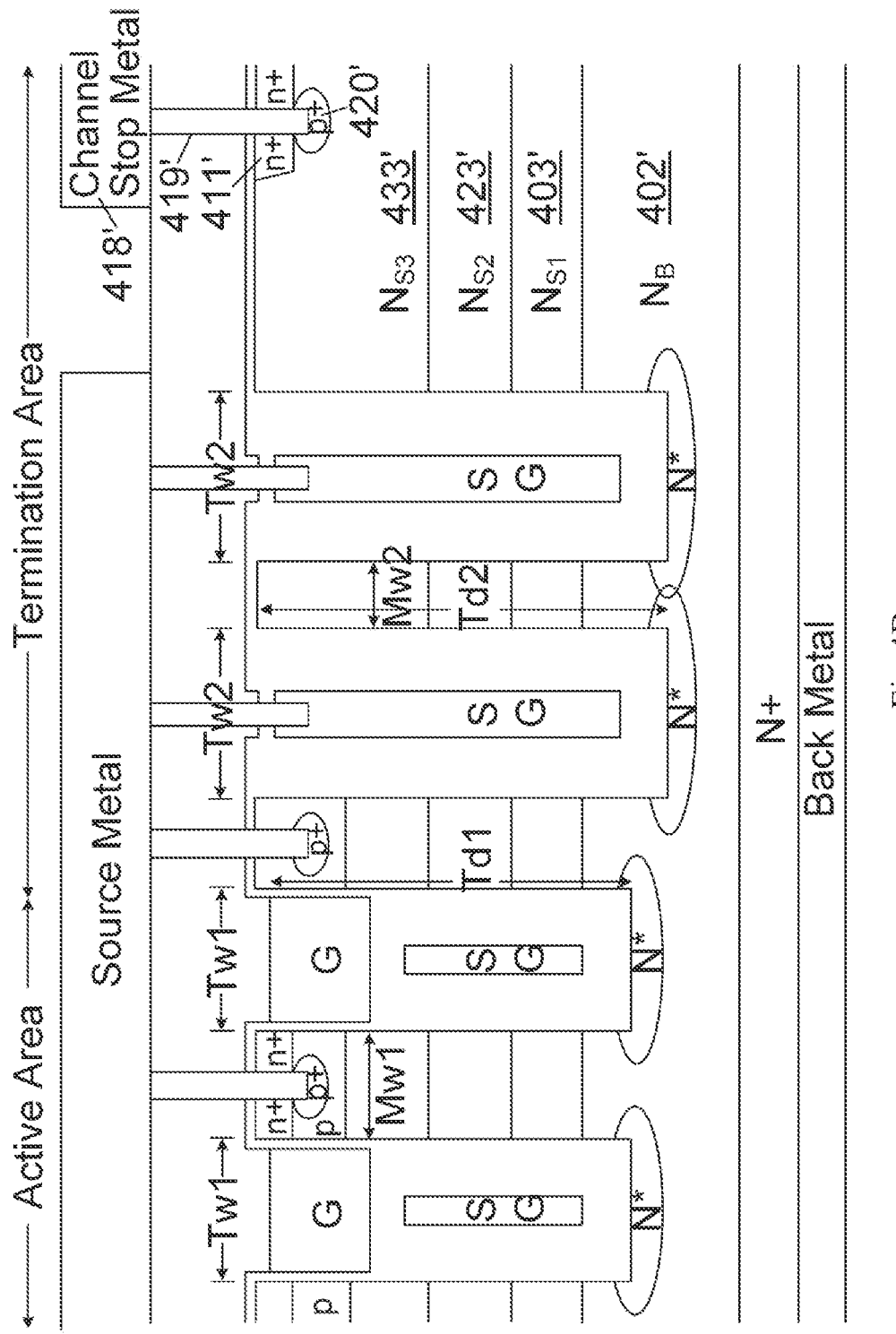
FIG. 4B is a cross-sectional view of another preferred embodiment according to the present invention.

Please refer to FIG. 4B for another preferred embodiment of the present invention with new and improved device structure having multiple stepped epitaxial layers. The N-channel trenched semiconductor power device has a similar structure to FIG. 4A, except that, in FIG. 4B, in the termination area, a channel stop metal 418' is connected with the n+ source region 411', the top epitaxial layer ($N_{S3}$, as illustrated) 433', and a p+ body contact doped region 420' through a trenched channel stop contact 419'.

Figure 4C:
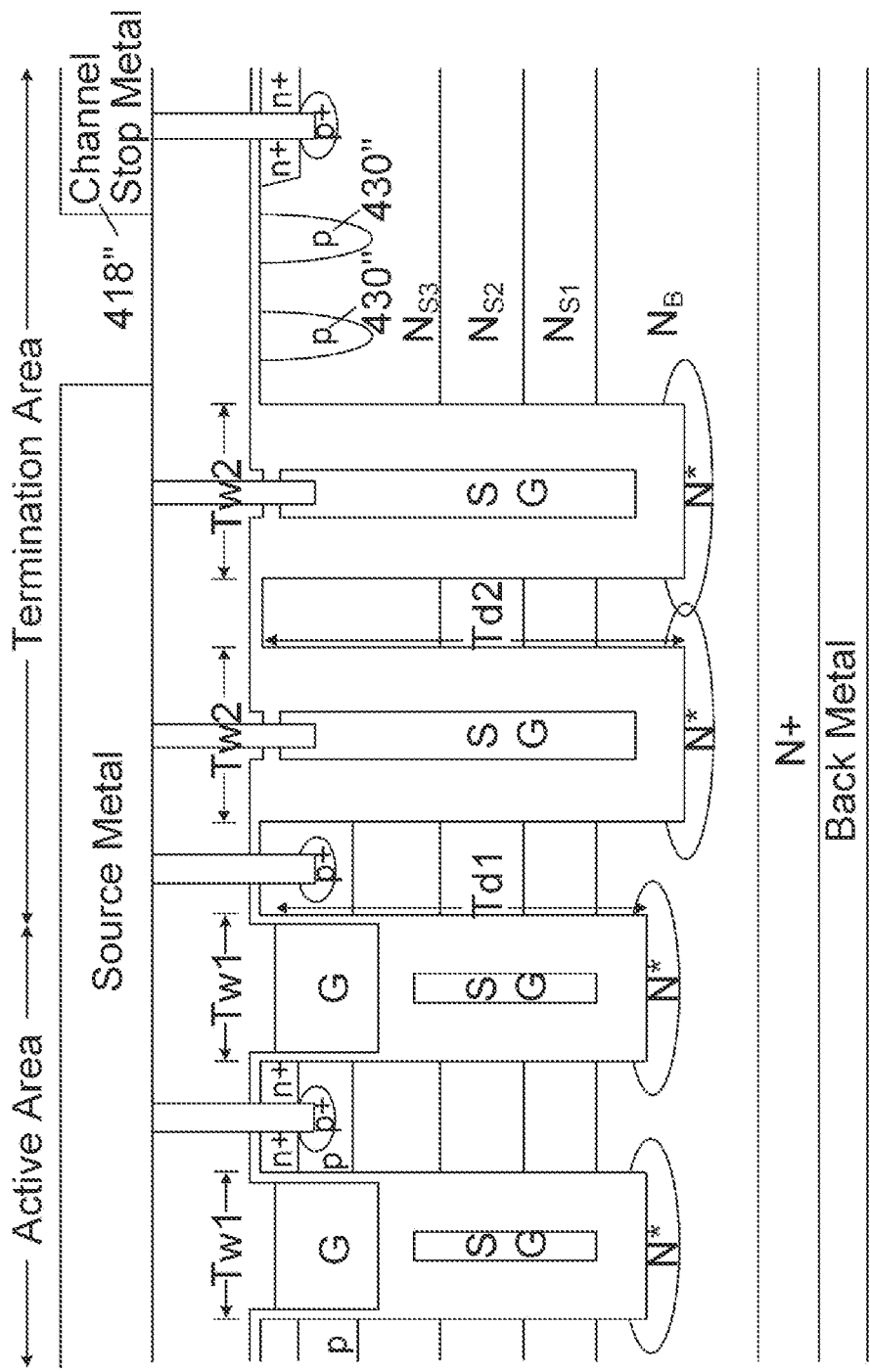
FIG. 4C is a cross-sectional view of another preferred embodiment according to the present invention.

Please refer to FIG. 4C for another preferred embodiment of the present invention with new and improved device structure having multiple stepped epitaxial layers. The N-channel trenched semiconductor power device has a similar structure to FIG. 4B, except that, in FIG. 4C, the termination area further comprises multiple floating P type edge body regions 430" having floating voltages and located between the edge trench and the channel stop metal 418".

Figure 4D:
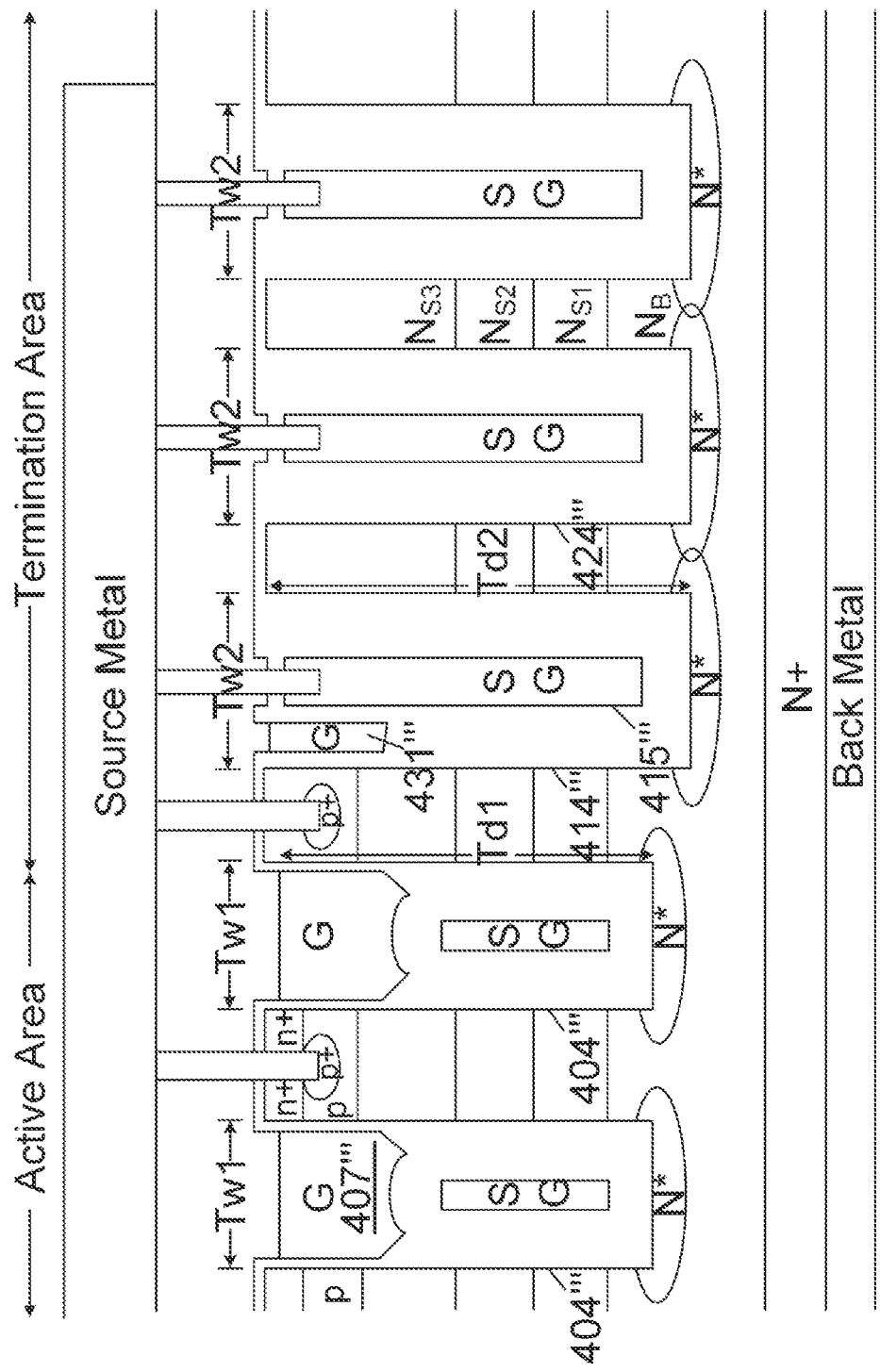
FIG. 4D is a cross-sectional view of another preferred embodiment according to the present invention.

Please refer to FIG. 4D for another preferred embodiment of the present invention with new and improved device structure having multiple stepped epitaxial layers. The N-channel trenched semiconductor power device has a similar structure to FIG. 4A, except that, in FIG. 4D, the shape of the gate electrode 407''' is different due to different process, and moreover, the trench filed plate 415''' formed in the first type edge trench 414''' in the termination area is surrounded with a gate electrode 431''' at sidewall of upper portion of the first type edge trench 414''' near the active area while a second type edge trench 424''' adjacent to the first type edge trench 414''' has the same structure as the edge trench in FIG. 4A. The trench width Tw1 of the first type edge trench 414''' is greater than or equal to the trench width Tw2 of the gate trench 404''' in the active area, and the trench depth Td1 of the first type edge trench 414''' is greater than or equal to the trench depth Td2 of the gate trench 404''' in the active area.

Figure 5A:
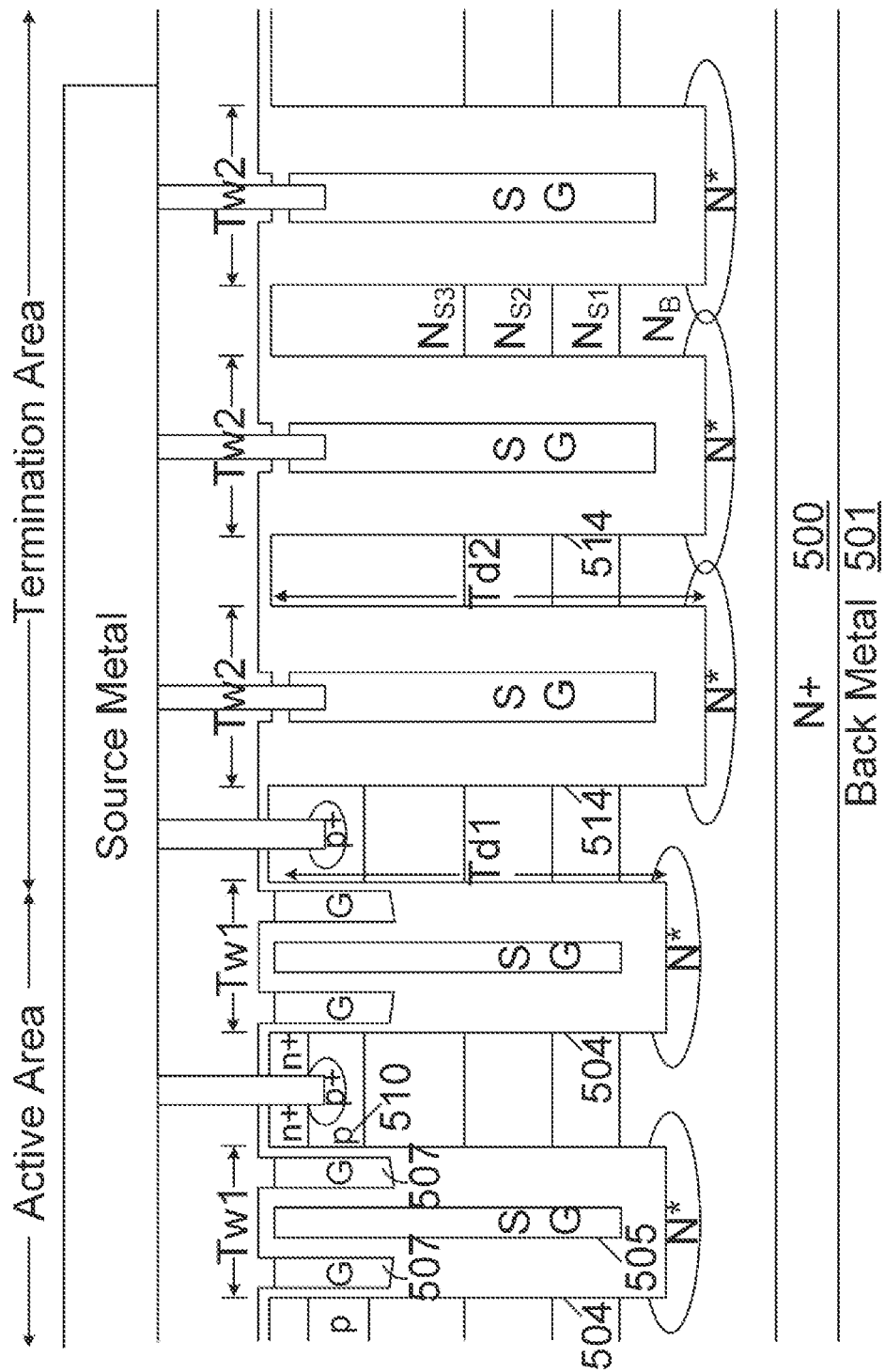
FIG. 5A is a cross-sectional view of another preferred embodiment according to the present invention.

Please refer to FIG. 5A for another preferred embodiment of the present invention with new and improved device structure having multiple stepped epitaxial layers. The N-channel trenched semiconductor power device has a similar structure to FIG. 4A, except for the different shielded gate structure in the gate trenches 504 in the active area. Inside each of the gate trenches 504, a shielded gate electrode (SG, as illustrated) 505 is disposed in the middle and gate electrode (G, as illustrated) 507 is disposed surrounding upper portions of the shielded electrode 505.

Figure 5B:
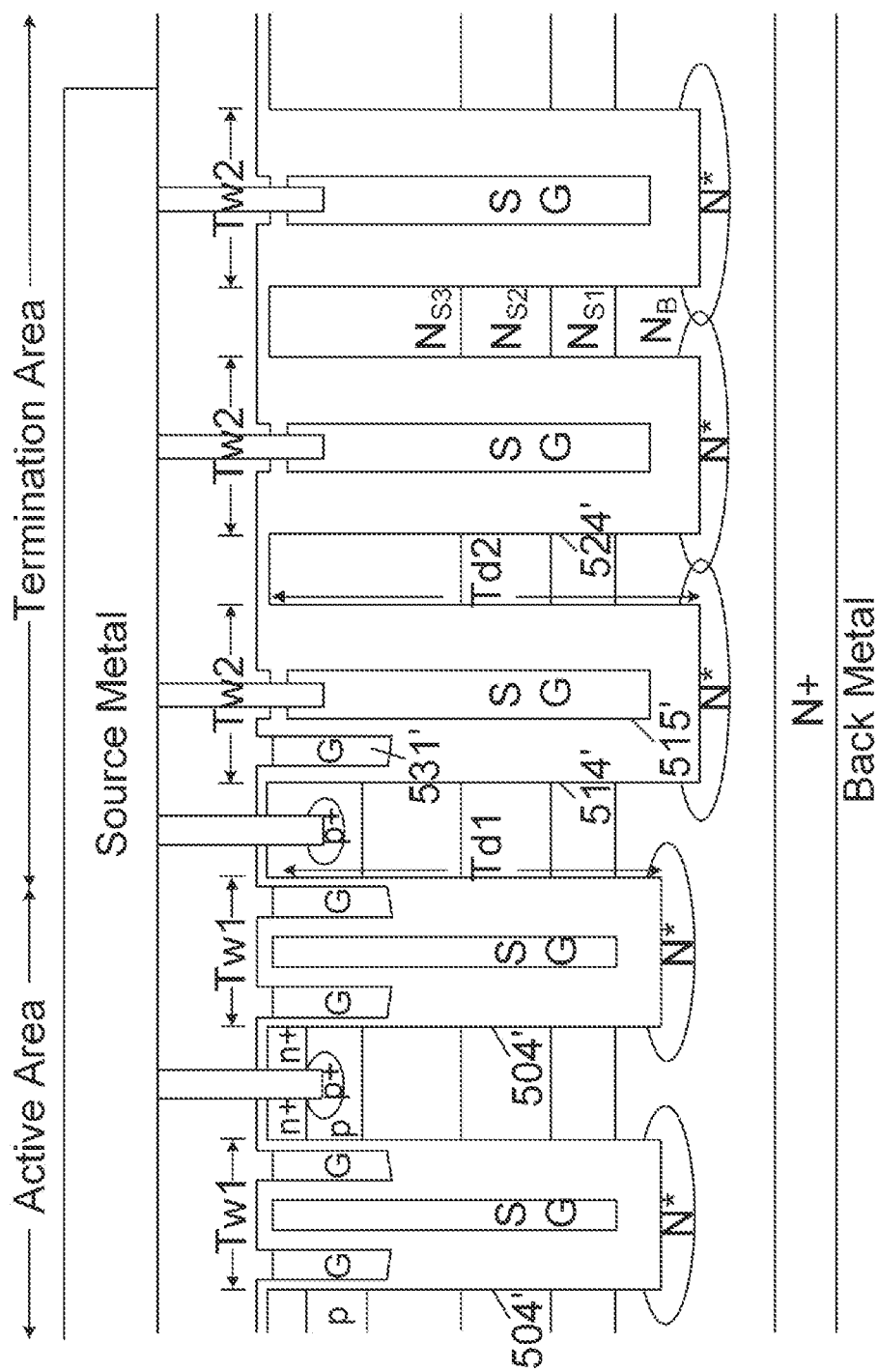
FIG. 5B is a cross-sectional view of another preferred embodiment according to the present invention.

Please refer to FIG. 5B for another preferred embodiment of the present invention with new and improved device structure having multiple stepped epitaxial layers. The N-channel trenched semiconductor power device has a similar structure to FIG. 5A, except that, in FIG. 5B, the trench field plate 515' formed in the first type edge trench 514' in the termination area is surrounded with a gate electrode 531' at a sidewall of upper portion of the first type edge trench 514' near the active area while a second type edge trench 524' adjacent to the first type edge trench 514' has the same structure as the edge trench in FIG. 5A. The trench width Tw1 of the first type edge trench 514' is greater than or equal to the trench width Tw2 of the gate trench 504' in the active area, and the trench depth Td1 of the first type edge trench 514' is greater than or equal to the trench depth Td2 of the gate trench 504' in the active area.

Figure 6:
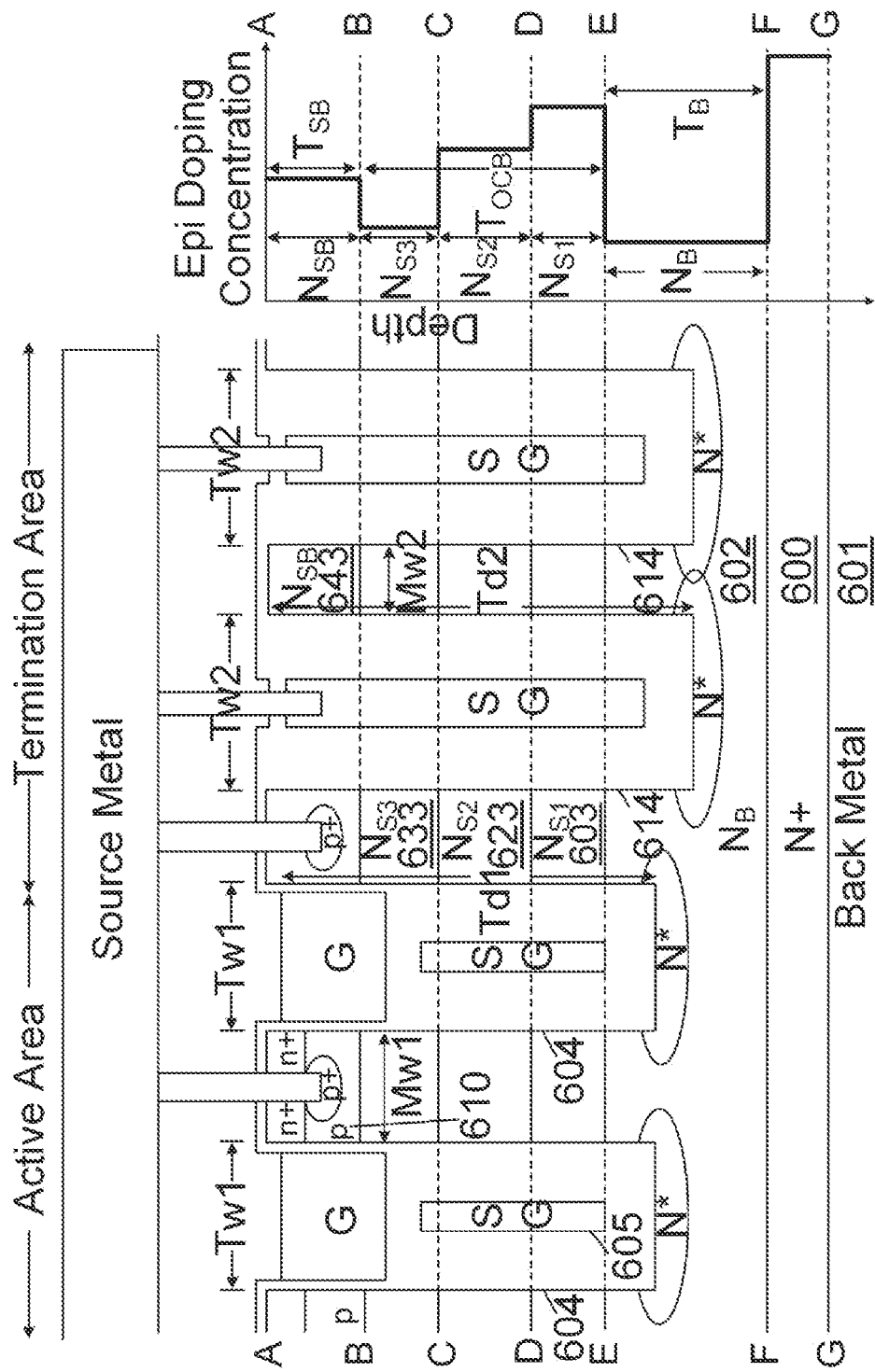
FIG. 6 is a cross-sectional view of another preferred embodiment wherein the doping concentration variations are depicted along the vertical direction according to the present invention.

Please refer to FIG. 6 for another preferred embodiment of the present invention with new and improved device structure having multiple stepped epitaxial layers wherein the doping concentration variations as grown are depicted along the vertical direction. The N-channel trenched semiconductor power device has a similar structure to FIG. 4A, except for the different epitaxial layer structure. In FIG. 6, an OCB region $T_{OCB}$ is formed between two adjacent of the gate trenches 604 below the body regions 610 and above a bottom of the shielded gate electrode 605 (between B-B and E-E lines), a buffer region $T_B$ is formed between the N+ substrate 600 and a bottom of the shielded gate electrode 605 (between E-E and F-F lines), the epitaxial layer in the OCB region has three stepped epitaxial layers with different doping concentrations including a bottom $1^{st}$ epitaxial layer ($N_{S1}$, as illustrated between D-D and E-E lines) 603 above the buffer epitaxial layer (NB, as illustrated between E-E and F-F lines) 602 with a doping concentration D1, a middle $2^{nd}$ epitaxial layer ($N_{S2}$, as illustrated between C-C and D-D lines) 623 above the $1^{st}$ epitaxial layer 603 with a doping concentration D2 and a top 3rd epitaxial layer ($N_{S3}$, as illustrated between B-B and C-C lines) 633 above the $2^{nd}$ epitaxial layer 623 with a doping concentration D3, wherein D3<D2<D1, to further reduce the specific on-resistance. The D2 can be an average of D1 and D3. Moreover, an epitaxial layer 643 in source regions and body regions $T_{SB}$ ($N_{SB}$, as illustrated between A-A and B-B lines) has a doping concentration $D_{SB}$ higher than that of the top 3rd epitaxial layer 633 of the MSE layers in the OCB region $T_{OCB}$, and the buffer epitaxial layer 602 has a doping concentration $D_B$ lower than each of the MSE layers in the OCB region $T_{OCB}$. The mesa width between two adjacent of the gate trenches 604 is equal to or larger than that between two adjacent of the edge trenches 614 (Tw1≥Mw2).

Figure 7A:
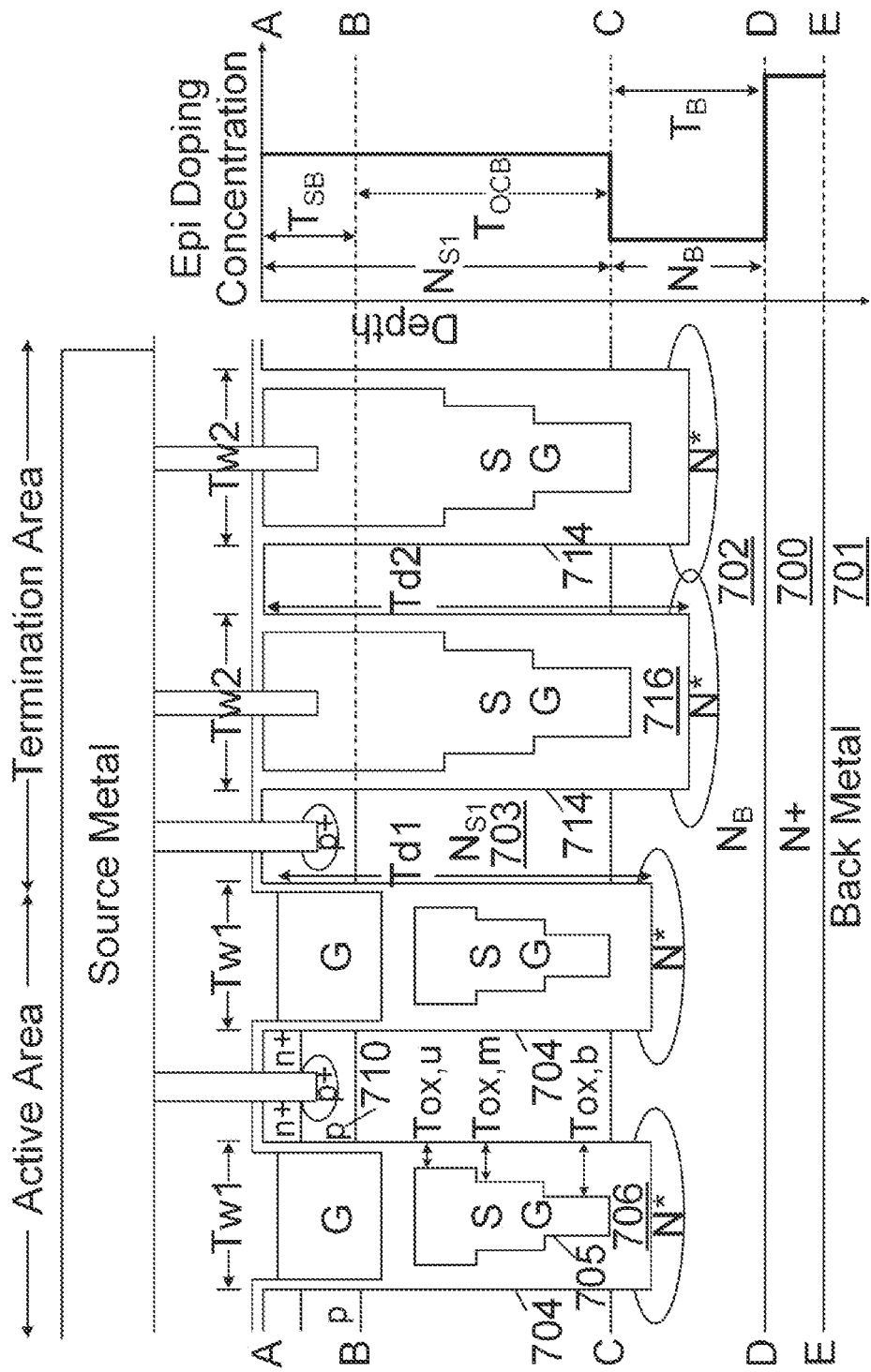
FIG. 7A is a cross-sectional view of another preferred embodiment wherein the doping concentration variations are depicted along the vertical direction according to the present invention.

Please refer to FIG. 7A for another preferred embodiment of the present invention with new and improved device structure having two stepped epitaxial layers and three stepped oxide structure wherein the doping concentration variations as grown are depicted along the vertical direction. The N-channel trenched semiconductor power device has a similar structure to FIG. 2A, except for the different epitaxial layer structure and the different first and second insulating films. In FIG. 7A, an OCB region $T_{OCB}$ is formed between two adjacent of the gate trenches 704 below the body regions 710 and above a bottom of the shielded gate electrode 705 (between B-B and C-C lines), a buffer region $T_B$ is formed between the N+ substrate 700 and a bottom of the shielded gate electrode 705, the epitaxial layer ($N_{S1}$, as illustrated between A-A and C-C lines) 703 in the OCB region $T_{OCB}$ has a uniform doping concentration $D_{S1}$, and the epitaxial layer in source regions and body regions $T_{SB}$ has a doping concentration same as the epitaxial layer 703 in the OCB region $T_{OCB}$, and the buffer epitaxial layer (NB, as illustrated between C-C and D-D lines) 702 has a doping concentration $D_B$ lower than the doping concentration $D_{S1}$ of the epitaxial layer 703 in the OCB region. Moreover, the first insulating film 706 in a single gate trench 704 has three stepped oxide structure having a lower portion oxide along lower portion sidewalls and bottom of the gate trenches 704 with a uniform first thickness Tox,b, a middle portion oxide with a uniform second thickness Tox,m, and an upper portion oxide with a uniform third thickness Tox,u, where Tox,b is greater than Tox,m, and Tox,m is greater than Tox,u, to further reduce the on-resistance while maintaining the same breakdown voltage. The Tox,m can be an average of Tox,b and Tox,u. The second insulating film 716 in a single edge trench 714 has similar three stepped oxide structure as the first insulating film 706 in the gate trench 704. An N type electric field reducing region N* with a doping concentration D* is disposed surrounding each bottom of gate trenches 704 in the active area and edge trenches 714 in the termination area, wherein the doping concentration D* is lower than the doping concentration $D_B$ of the buffer epitaxial layer 702.

Figure 7B:
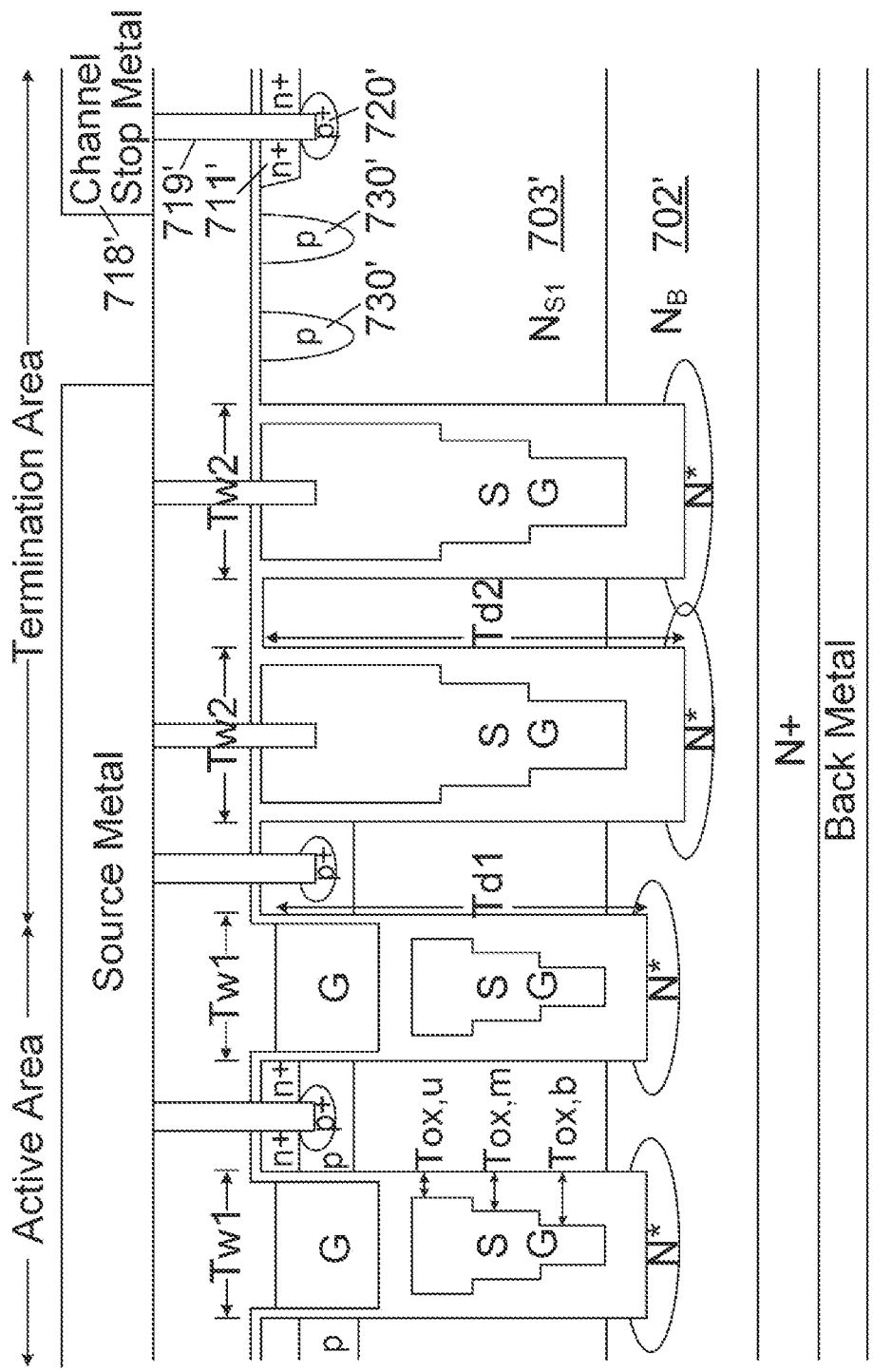
FIG. 7B is a cross-sectional view of another preferred embodiment according to the present invention.

Please refer to FIG. 7B for another preferred embodiment of the present invention with new and improved device structure having two stepped epitaxial layers and three stepped oxide structure. The N-channel trenched semiconductor power device has a similar structure to FIG. 7A, except that, in FIG. 7B, in the termination area, a channel stop metal 718' is connected with the n+ source region 711', the top epitaxial layer ($N_{S1}$, as illustrated) 703', and a p+ body contact doped region 720' through a trenched channel stop contact 719'. The termination area further comprises multiple floating P type edge body regions 730' having floating voltages and located between the edge trench and the channel stop metal 718'.

Figure 8A:
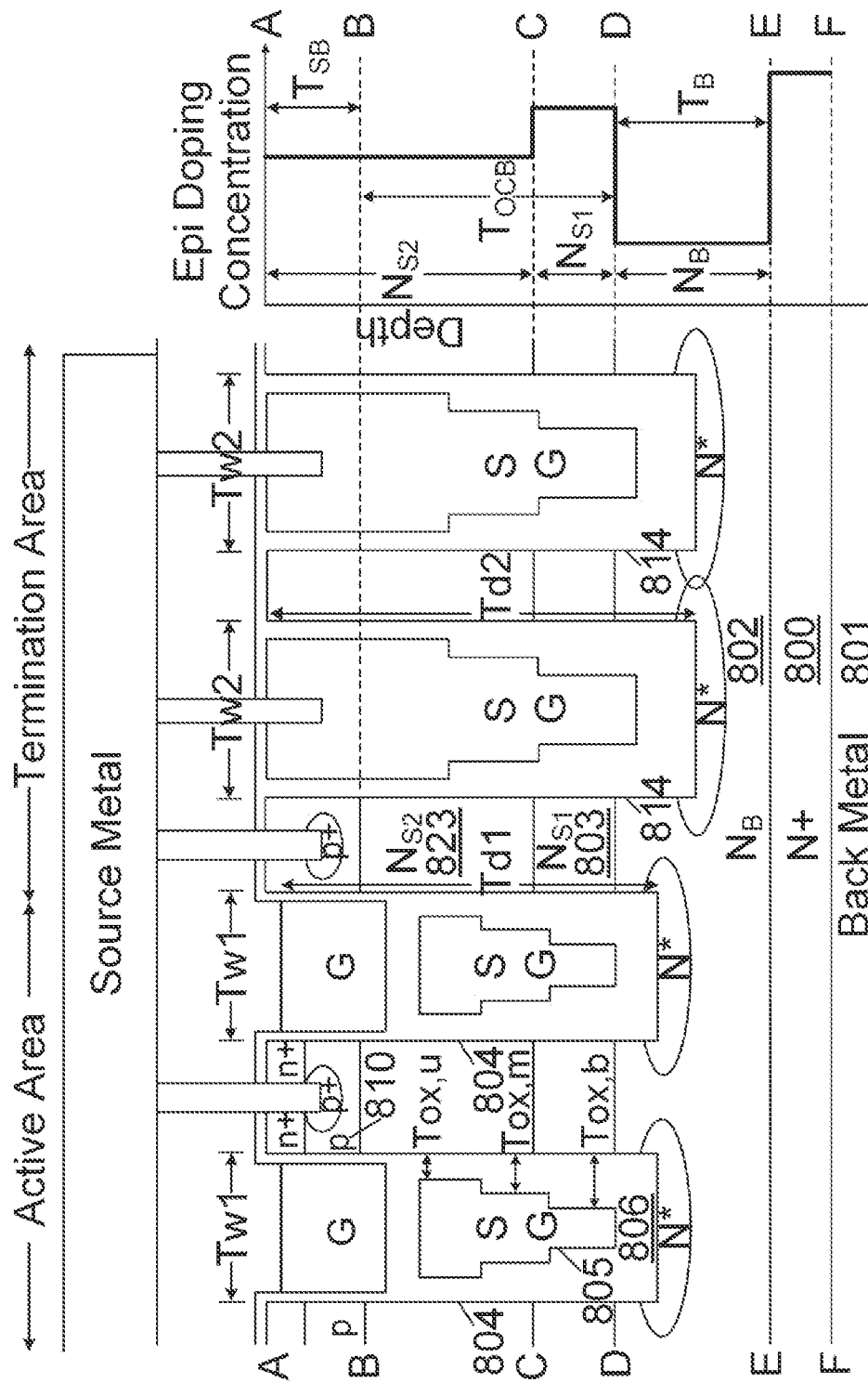
FIG. 8A is a cross-sectional view of another preferred embodiment wherein the doping concentration variations are depicted along the vertical direction according to the present invention.

Please refer to FIG. 8A for another preferred embodiment of the present invention with new and improved device structure having three stepped epitaxial layers and three stepped oxide structure wherein the doping concentration variations as grown are depicted along the vertical direction. The N-channel trenched semiconductor power device has a similar structure to FIG. 7A, except for the different epitaxial layer structure. In FIG. 8A, an OCB region $T_{OCB}$ is formed between two adjacent of the gate trenches 804 below the body regions 810 and above a bottom of the shielded gate electrode 805 (between B-B and D-D lines), a buffer region $T_B$ is formed between the N+ substrate 800 and a bottom of the shielded gate electrode 805, the epitaxial layer in the OCB region $T_{OCB}$ has two stepped epitaxial layers with different doping concentrations including a bottom $1^{st}$ epitaxial layer ($N_{S1}$, as illustrated between C-C and D-D lines) 803 above a buffer epitaxial layer (NB, as illustrated between D-D and E-E lines) 802 with a doping concentration D1 and a top $2^{nd}$ epitaxial layer ($N_{S2}$, as illustrated between A-A and C-C lines) 823 above the $1^{st}$ epitaxial layer 803 with a doping concentration D2, wherein D2<D1, and the epitaxial layer in source regions and body regions has a doping concentration same as the top $2^{nd}$ epitaxial layer 823 in the OCB region $T_{OCB}$, and the buffer epitaxial layer 802 has a doping concentration $D_B$ lower than the top $2^{nd}$ epitaxial layer 823 in the OCB region $T_{OCB}$. An N type electric field reducing region N* with a doping concentration D* is disposed surrounding each bottom of gate trenches 804 in the active area and edge trenches 814 in the termination area, wherein the doping concentration D* is lower than the doping concentration $D_B$ of the buffer epitaxial layer 802.

Figure 8B:
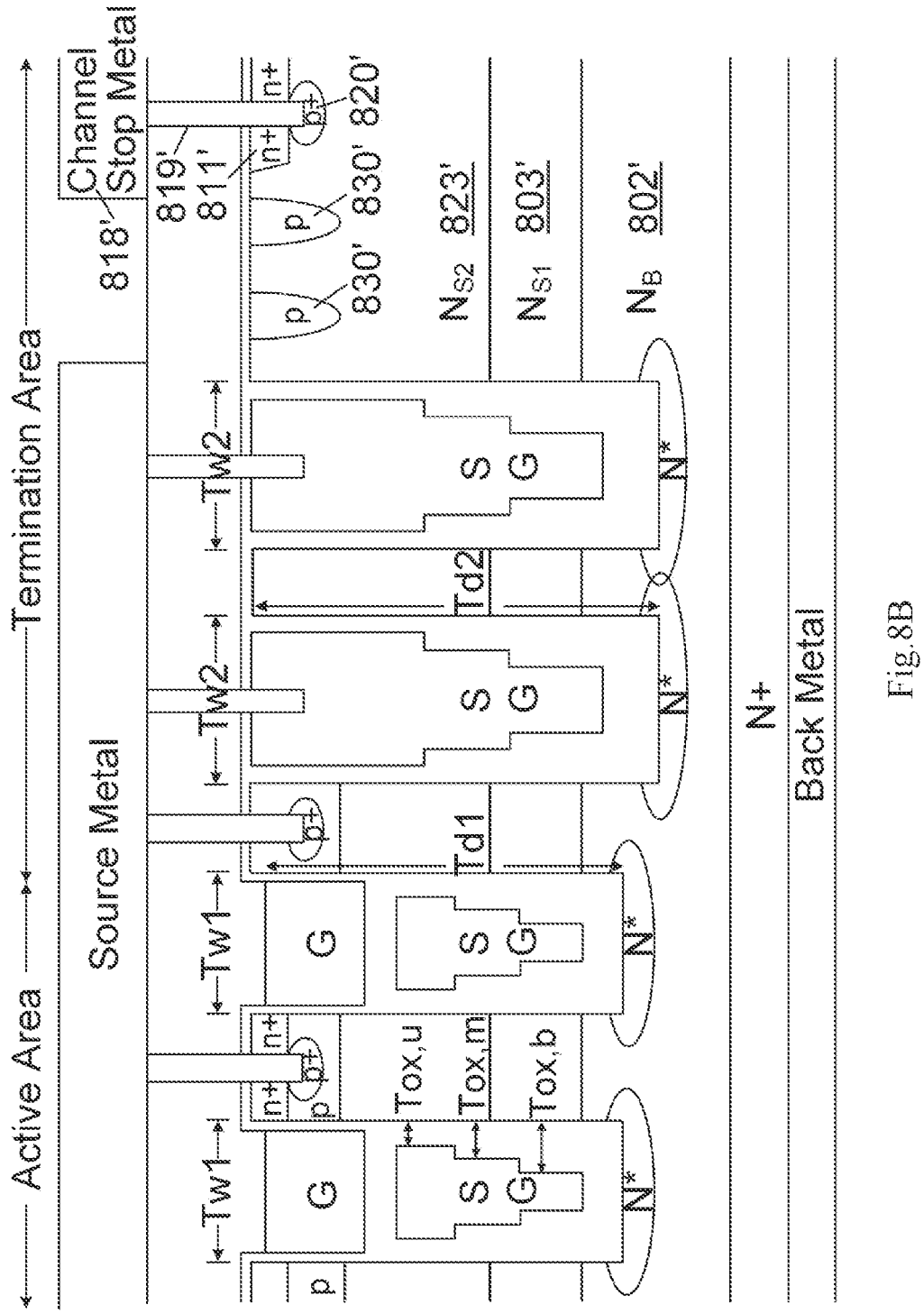
FIG. 8B is a cross-sectional view of another preferred embodiment according to the present invention.

Please refer to FIG. 8B for another preferred embodiment of the present invention with new and improved device structure having three stepped epitaxial layers and three stepped oxide structure. The N-channel trenched semiconductor power device has a similar structure to FIG. 8A, except that, in FIG. 8B, in the termination area, a channel stop metal 818' is connected with the n+ source region 811', the top epitaxial layer ($N_{S1}$, as illustrated) 803', and a p+ body contact doped region 820' through a trenched channel stop contact 819'. The termination area further comprises multiple floating P type edge body regions 830' having floating voltages and located between the edge trench and the channel stop metal 818'.

Figure 9A:
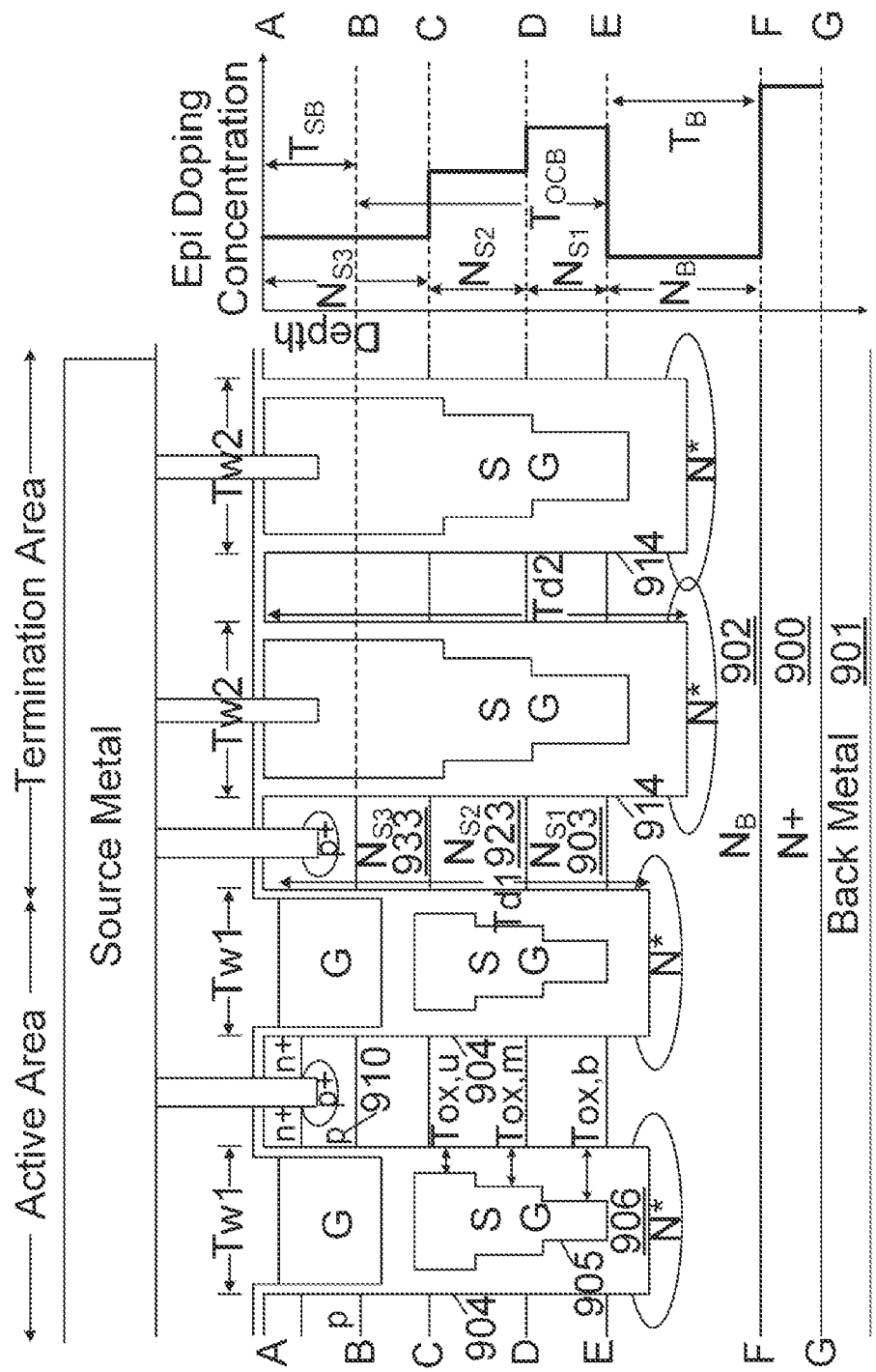
FIG. 9A is a cross-sectional view of another preferred embodiment wherein the doping concentration variations are depicted along the vertical direction according to the present invention.

Please refer to FIG. 9A for another preferred embodiment of the present invention with new and improved device structure having multiple stepped epitaxial layers and three stepped oxide structure wherein the doping concentration variations as grown are depicted along the vertical direction. The N-channel trenched semiconductor power device has a similar structure to FIG. 8A, except for the different epitaxial layer structure. In FIG. 9A, an OCB region $T_{OCB}$ is formed between two adjacent of the gate trenches 904 below the body regions 910 and above a bottom of the shielded gate electrode 905 (between B-B and E-E lines)), a buffer region $T_B$ is formed between the N+ substrate 900 and a bottom of the shielded gate electrode 905, the multiple stepped epitaxial layers in the OCB region $T_{OCB}$ has three stepped epitaxial layers with different doping concentrations including a bottom $1^{st}$ epitaxial layer ($N_{S1}$, as illustrated between D-D and E-E lines) 903 above the buffer epitaxial layer (NB, as illustrated between E-E and F-F lines) 902 with a doping concentration D1, a middle $2^{nd}$ epitaxial layer ($N_{S2}$, as illustrated between C-C and D-D lines) 923 above the $1^{st}$ epitaxial layer 903 with a doping concentration D2 and a top 3rd epitaxial layer ($N_{S3}$, as illustrated between A-A and C-C lines) 933 above the $2^{nd}$ epitaxial layer 923 with a doping concentration D3, wherein D3<D2<D1, to further reduce the specific on-resistance. The D2 can be an average of D1 and D3. Moreover, an epitaxial layer in source regions and body regions $T_{SB}$ has the same doping concentration as the top 3rd epitaxial layer 933 of the MSE layers in the OCB region $T_{OCB}$, and the buffer epitaxial layer 902 has a doping concentration $D_B$ lower than each of the MSE layers in the OCB region $T_{OCB}$. An N type electric field reducing region N* with a doping concentration D* is disposed surrounding each bottom of gate trenches 904 in the active area and edge trenches 914 in the termination area, wherein the doping concentration D* is lower than the doping concentration $D_B$ of the buffer epitaxial layer 902.

Figure 9B:
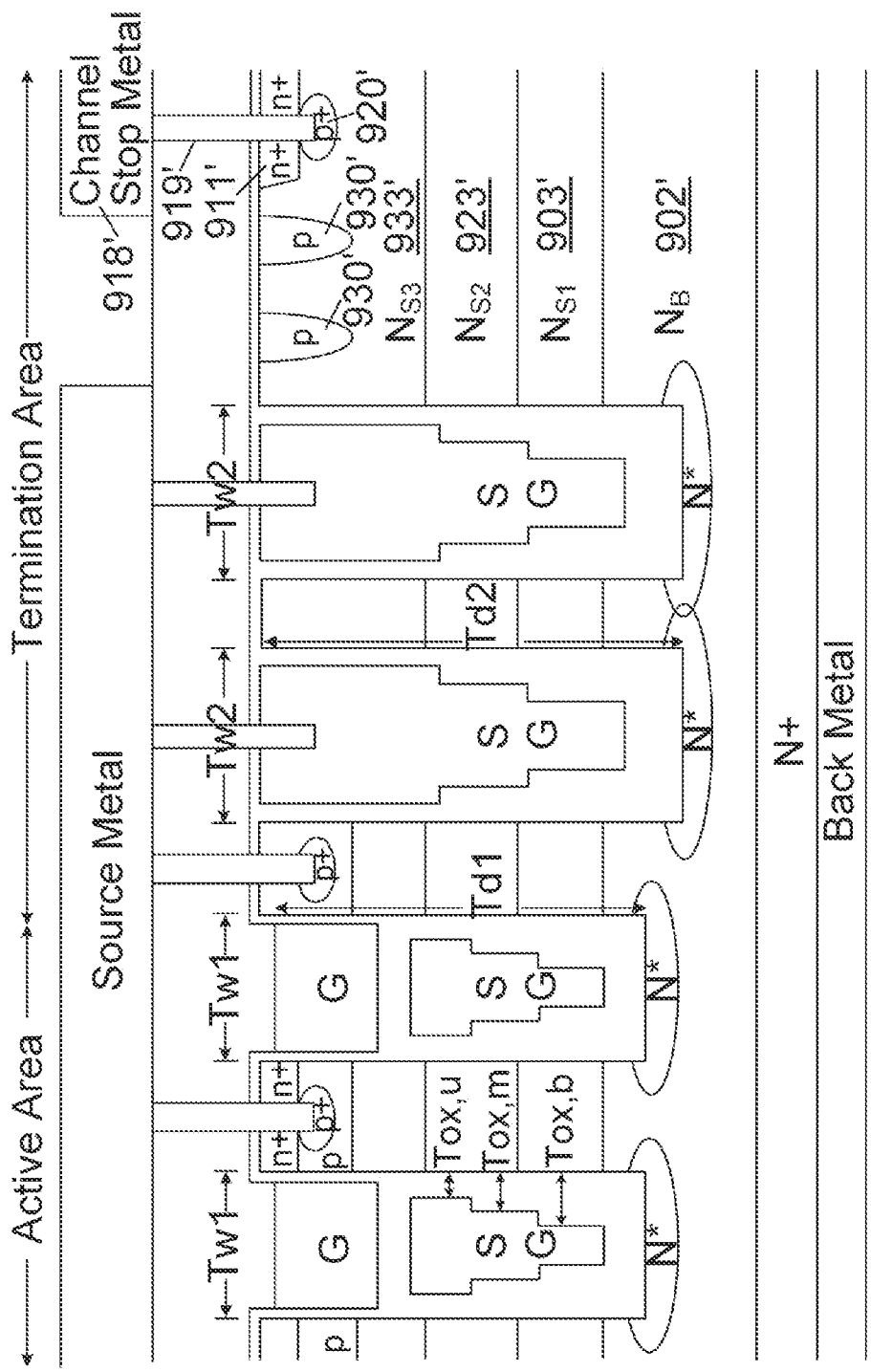
FIG. 9B is a cross-sectional view of another preferred embodiment according to the present invention.

Please refer to FIG. 9B for another preferred embodiment of the present invention with new and improved device structure having multiple stepped epitaxial layers and three stepped oxide structure. The N-channel trenched semiconductor power device has a similar structure to FIG. 9A, except that, in FIG. 9B, in the termination area, a channel stop metal 918' is connected with the n+ source region 911', the top epitaxial layer ($N_{S3}$, as illustrated) 933', and a p+ body contact doped region 920' through a trenched channel stop contact 919'. The termination area further comprises multiple floating P body regions 930' having floating voltages and located between the edge trench and the channel stop metal 918'.

Figure 10A:
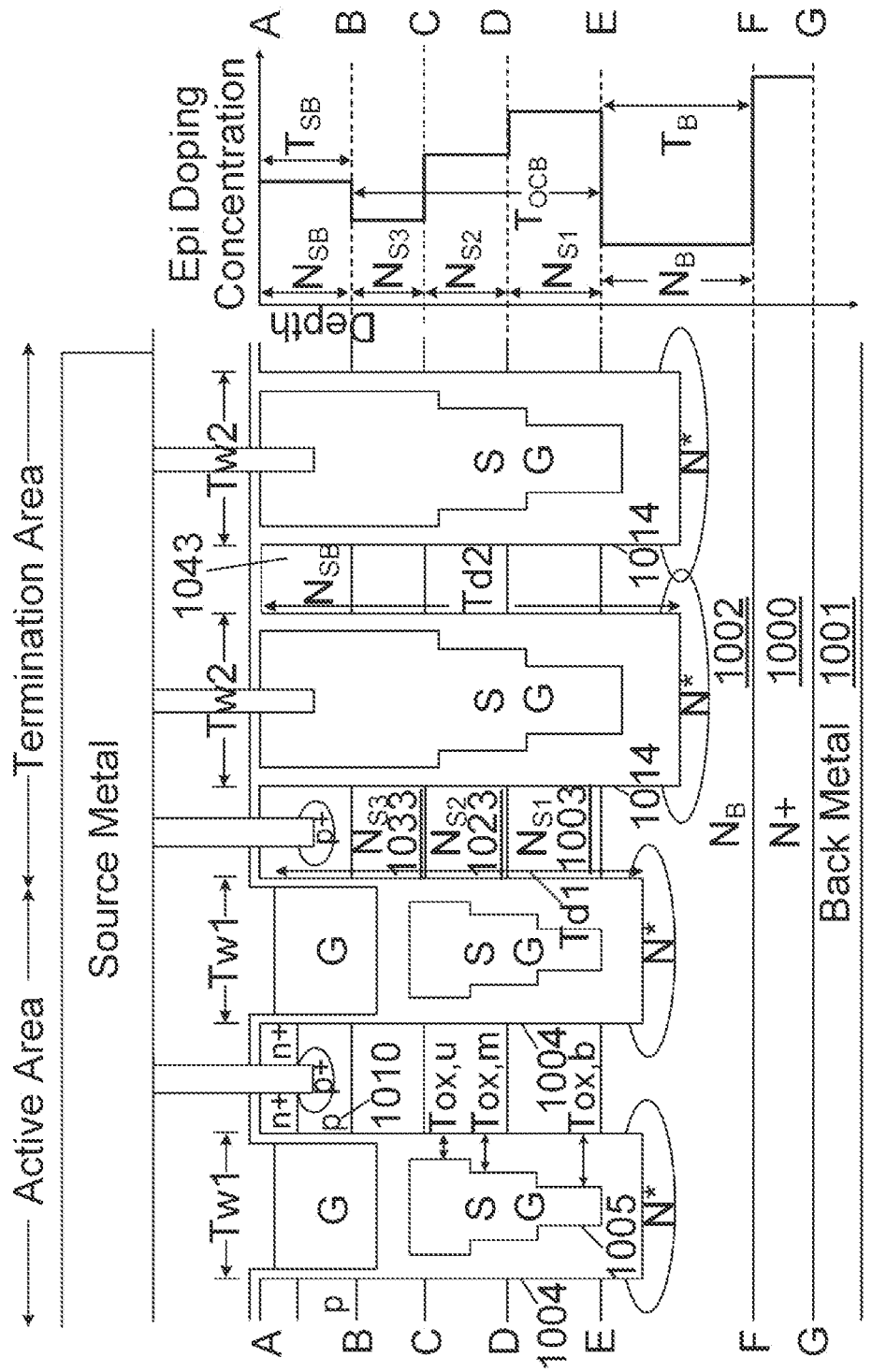
FIG. 10A is a cross-sectional view of another preferred embodiment wherein the doping concentration variations are depicted along the vertical direction according to the present invention.
Figure 10B:
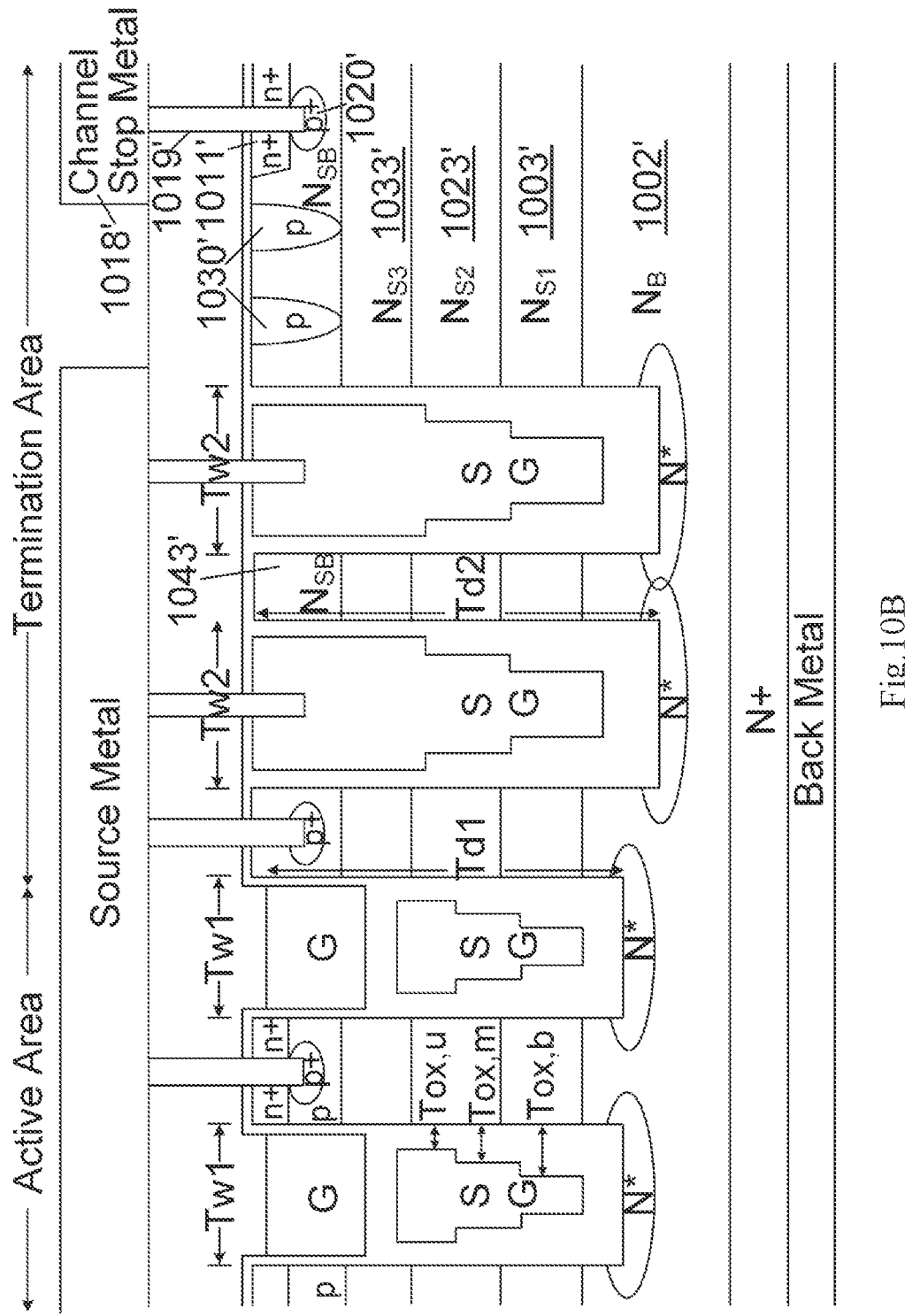
FIG. 10B is a cross-sectional view of another preferred embodiment according to the present invention.

Please refer to FIG. 10A for another preferred embodiment of the present invention with new and improved device structure having multiple stepped epitaxial layers and three stepped oxide structure wherein the doping concentration variations as grown are depicted along the vertical direction. The N-channel trenched semiconductor power device has a similar structure to FIG. 9A, except for the different epitaxial layer structure. In FIG. 10A, an OCB region $T_{OCB}$ is formed between two adjacent of the gate trenches 1004 below the body regions 1010 and above a bottom of the shielded gate electrode 1005 (between B-B and E-E lines), a buffer region $T_B$ is formed between the N+ substrate 1000 and a bottom of the shielded gate electrode 1005, the multiple stepped epitaxial layers in the OCB region $T_{OCB}$ has three stepped epitaxial layers with different doping concentrations including a bottom 1$^{st}$ epitaxial layer ($N_{S1}$, as illustrated between D-D and E-E lines) 1003 above a buffer epitaxial layer (NB, as illustrated between E-E and F-F lines) 1002 with a doping concentration D1, a middle 2$^{nd}$ epitaxial layer ($N_{S2}$, as illustrated between C-C and D-D lines) 1023 above the 1$^{st}$ epitaxial layer 1003 with a doping concentration D2 and a top 3rd epitaxial layer ($N_{S3}$, as illustrated between B-B and C-C lines) 1033 above the 2$^{nd}$ epitaxial layer 1023 with a doping concentration D3, wherein D3<D2<D1, to further reduce the specific on-resistance. The D2 can be an average of D1 and D3. Moreover, an epitaxial layer in source regions and body regions $T_{SB}$ ($N_{SB}$, as illustrated between A-A and B-B lines) 1043 has a doping concentration higher than the top 3rd epitaxial layer 1033 of the MSE layers in the OCB region $T_{OCB}$, and the buffer epitaxial layer 1002 has a doping concentration $D_B$ lower than each of the MSE layers in the OCB region $T_{OCB}$.

please refer to FIG. 10B for another preferred embodiment of the present invention with new and improved device structure having multiple stepped epitaxial layers and three stepped oxide structure. The N-channel trenched semiconductor power device has a similar structure to FIG. 10A, except that, in FIG. 10B, in the termination area, a channel stop metal 1018' is connected with the n+ source region 1011', the top epitaxial layer ($N_{SB}$, as illustrated) 1043', and a p+ body contact doped region 1020' through a trenched channel stop contact 1019'. The termination area further comprises multiple floating P type edge body regions 1030' having floating voltages and located between the edge trench and the channel stop metal 1018'.

Figure 11:
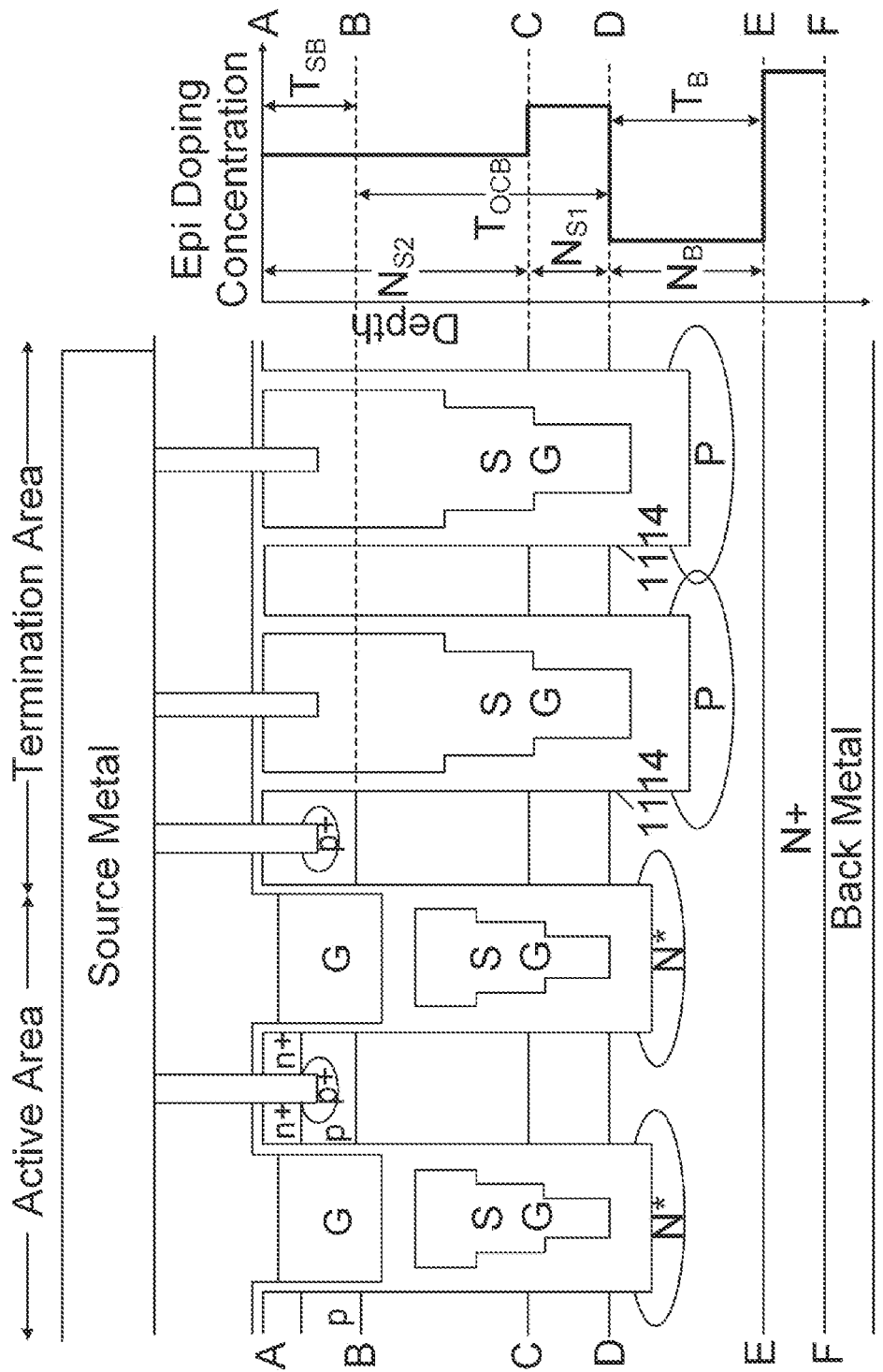
FIG. 11 is a cross-sectional view of another preferred embodiment wherein a P type electric field reducing regions is depicted according to the present invention.

Please refer to FIG. 11 for another preferred embodiment of the present invention with new and improved device structure having three stepped epitaxial layers and three stepped oxide structure. The N-channel trenched semiconductor power device has a similar structure to FIG. 8A, except that, in FIG. 11A, in the termination area, a P type electric field reducing region is disposed surrounding each bottom of the edge trenches 1114 for further reducing electric field strength.

Figure 12:
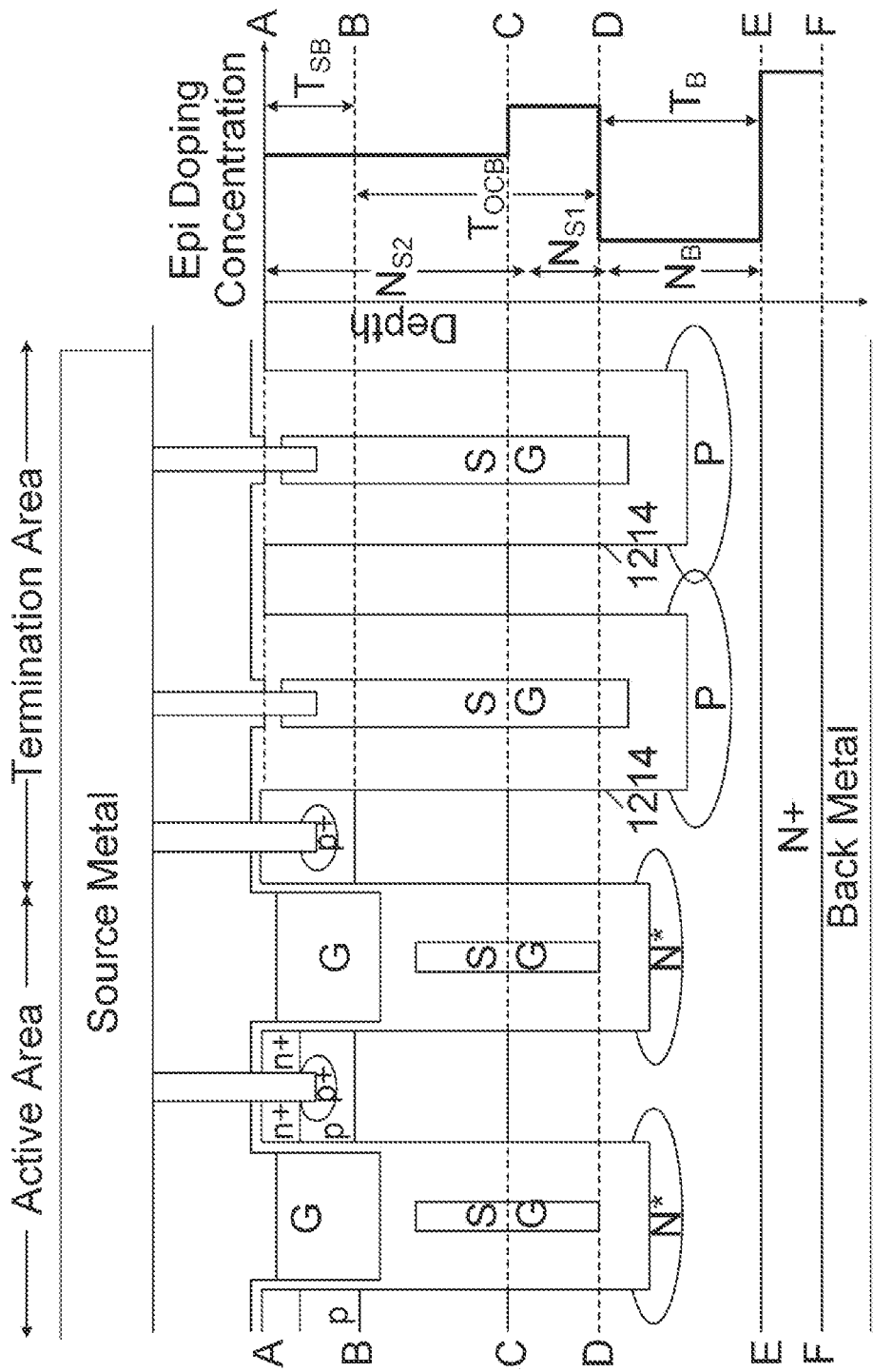
FIG. 12 is a cross-sectional view of another preferred embodiment wherein a P type electric field reducing region is depicted according to the present invention.

Please refer to FIG. 12 for another preferred embodiment of the present invention with new and improved device structure having three stepped epitaxial layers and a P type electric field reducing region surrounding each bottom of the edge trenches 1214. The N-channel trenched semiconductor power device has a similar structure to FIG. 2A, except that, in FIG. 12, the three stepped epitaxial layers and the P type electric field reducing region surrounding each bottom of the edge trenches 1214 are same as FIG. 11.

Figure 13:
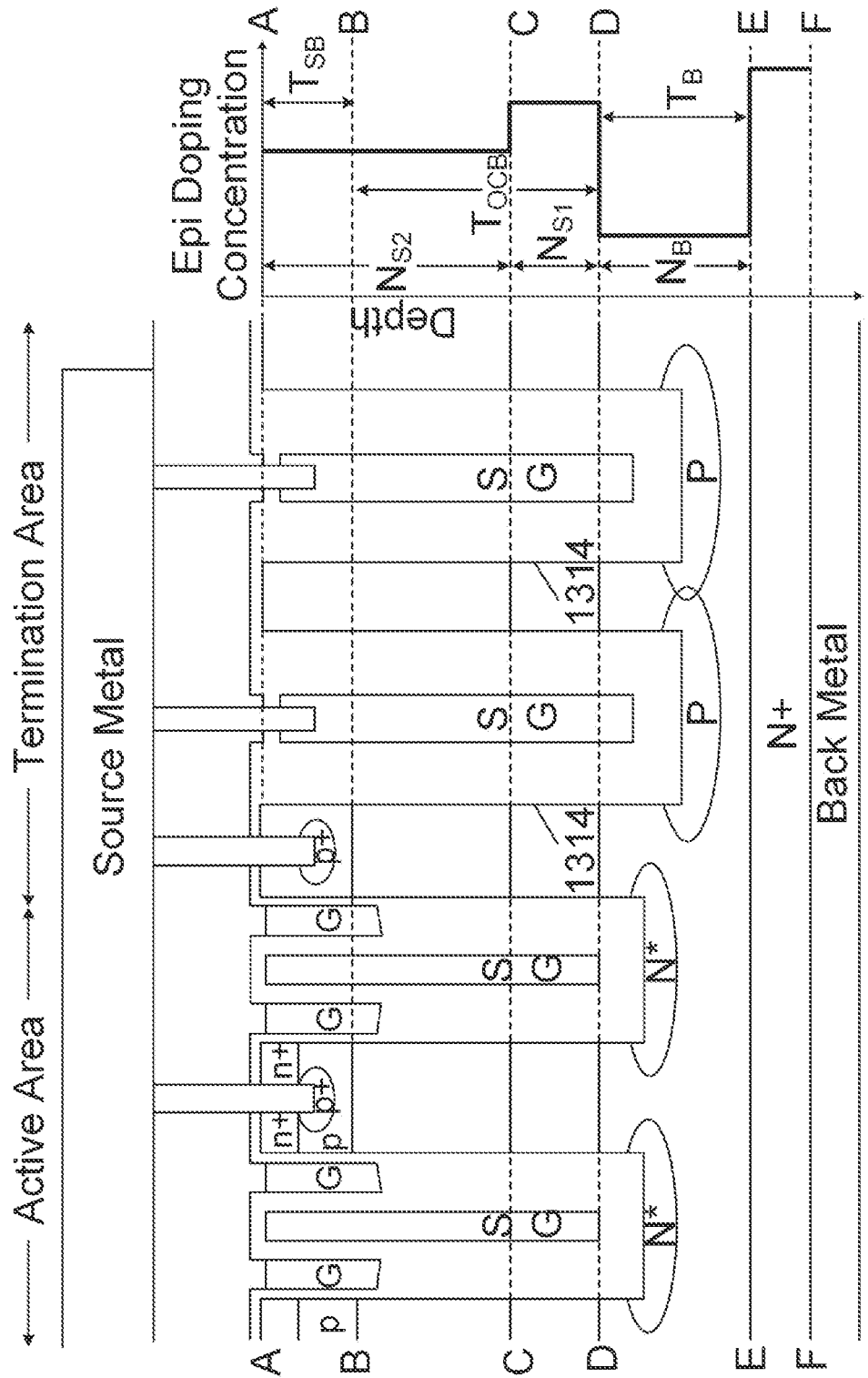
FIG. 13 is a cross-sectional view of another preferred embodiment wherein a P type electric field reducing region is depicted according to the present invention.

Please refer to FIG. 13 for another preferred embodiment of the present invention with new and improved device structure having three stepped epitaxial layers and a P type electric field reducing region surrounding each bottom of the edge trenches 1314. The N-channel trenched semiconductor power device has a similar structure to FIG. 5A, except that, in FIG. 13, the three stepped epitaxial layers and the P type electric field reducing region surrounding each bottom of the edge trenches 1314 are same as FIG. 11.

Although the present invention has been described in terms of the presently preferred embodiments, it is to be understood that such disclosure is not to be interpreted as limiting. The embodiments described above often show N-channel devices, the embodiments can also be applied to P-channels devices by reversing the polarities of the conductivity types. Various alternations and modifications will no doubt become apparent to those skilled in the art after reading the above disclosure. Accordingly, it is intended that the appended claims be interpreted as covering all alternations and modifications as fall within the true spirit and scope of the invention.

What is claimed is:

1. A shielded gate trench (SGT) MOSFET formed in an epitaxial layer of a first conductivity type onto a substrate of said first conductivity type, comprising:
   a plurality of gate trenches formed in an active area, surrounded by source regions of said first conductivity type are encompassed in body regions of a second conductivity type near a top surface of said epitaxial layer, each of said plurality of gate trenches is filled with a gate electrode and a shielded gate electrode; said shielded gate electrode is insulated from said epitaxial layer by a first insulating film, said gate electrode is insulated from said epitaxial layer by a gate oxide, said shielded gate electrode and said gate electrode are insulated from each other by an Inter-Poly Oxide (IPO) film, said gate oxide surrounds said gate electrode and has less thickness than said first insulating film;
   an Oxide Charge Balance (OCB) region formed between two adjacent of said plurality of gate trenches below said body regions and above a bottom of said shielded gate electrode;
   a buffer region formed between said substrate and said OCB region;
   said body regions, said shielded gate electrode and said source regions are shorted together to a source metal through a plurality of trench contacts;
   said epitaxial layer in said OCB region has multiple stepped epitaxial (MSE) layers with different doping concentrations decreasing stepwise in a direction from a bottom of said shielded gate electrode to said body regions along sidewalls of said plurality of gate trenches, wherein each of said multiple stepped-epitaxial layers has a uniform doping concentration as grown;
   said SGT MOSFET further comprising an edge termination area having multiple edge trenches; a trench field plate is disposed in each of said multiple edge trenches and insulated from said epitaxial layer by a second insulating film, wherein said each of said multiple edge trenches has a trench width and a trench depth greater than or equal to said each of said plurality of gate trenches in the said active area; and an electric field reducing region of said first conductivity type surrounding each bottom of said plurality of gate trenches in said active area and of said multiple edge trenches in said edge termination area with a doping concentration lower than said epitaxial layer in said buffer region.

2. The SGT MOSFET of claim 1, wherein said gate electrode is disposed above said shielded gate electrode.

3. The SGT MOSFET of claim 1, wherein said shielded electrode is disposed in the middle and said gate electrode is disposed surrounding upper portions of said shielded electrode.

4. The SGT MOSFET of claim 1, wherein said epitaxial layer in said buffer region has an epitaxial layer with a doping concentration same as a bottom epitaxial layer of said MSE layers in said OCB region.

5. The SGT MOSFET of claim 1, wherein said electric field reducing region is disposed by ion implantation of a dopant of said second conductivity type through each bottom of said plurality of gate trenches and said edge multiple trenches after said plurality of gate trenches and said multiple edge trenches are formed prior to said first insulating film and said second insulating film filling up bottoms and sidewalls of said plurality of gate trenches and said multiple edge trenches.

6. The SGT MOSFET of claim 1, wherein said epitaxial layer in said buffer region has a doping concentration lower than each of said MSE layers in said OCB region.

7. The SGT MOSFET of claim 1, wherein said edge termination area further comprising at least one edge body region of said second conductivity type disposed between a channel stop region and said multiple edge trenches having a floating voltage.

8. The SGT MOSFET of claim 1, wherein said MSE layers comprise at least two stepped epitaxial layers of different doping concentrations including the bottom epitaxial layer with a doping concentration D1 and a top epitaxial layer above said bottom epitaxial layer with a doping concentration D2, wherein said D2<said D1.

9. The SGT MOSFET of claim 1, wherein said MSE layers comprise at least three stepped epitaxial layers of different doping concentration including a bottom epitaxial layer with a doping concentration D1, a middle epitaxial layer with a doping concentration D2 and a top epitaxial layer with a doping concentration D3, wherein said D3<said D2<said D1.

10. The SGT MOSFET of claim 6, wherein said D2 is an average of said D1 and said D3.

11. The SGT MOSFET of claim 1, wherein said first insulating film is a single oxide film having a uniform thickness.

12. The SGT MOSFET of claim 1, wherein said first insulating film has a multiple stepped oxide structure with varying thicknesses decreasing stepwise in a direction from bottoms of said plurality of gate trenches to said body regions along sidewalls of said plurality of gate trenches.

13. The SGT MOSFET of claim 1, wherein said epitaxial layer in said source and body regions has a doping concentration same as a top epitaxial layer of said MSE layers in said OCB region.

14. The SGT MOSFET of claim 1, wherein said epitaxial layer in said source and body regions has a doping concentration higher than a top epitaxial layer of said MSE layers in said OCB region.

15. The SGT MOSFET of claim 1, wherein a mesa width between two adjacent of said plurality of gate trenches is equal to or larger than that between two adjacent of said multiple edge trenches.

16. A shielded gate trench MOFET formed in an epitaxial layer of a first conductivity type onto a substrate of said first conductivity type, comprising:

a plurality of gate trenches formed in an active area, surrounded by source regions of said first conductivity type are encompassed in body regions of a second conductivity type near a top surface of said epitaxial layer, each of said plurality of gate trenches is filled with a gate electrode and a shielded gate electrode; said shielded gate electrode is insulated from said epitaxial layer by a first insulating film, said gate electrode is insulated from said epitaxial layer by a gate oxide, said shielded gate electrode and said gate electrode are insulated from each other by an Inter-Poly Oxide (IPO) film, said gate oxide surrounds said gate electrode and has less thickness than said first insulating film;

an Oxide Charge Balance (OCB) region formed between two adjacent of said plurality of gate trenches below said body regions and above a bottom of said shielded gate electrode;

a buffer region formed between said substrate and said OCB region;

said body regions, said shielded gate electrode and said source regions are shorted together to a source metal through a plurality of trench contacts;

said epitaxial layer in said OCB region has multiple stepped epitaxial (MSE) layers with different doping concentrations decreasing stepwise in a direction from a bottom of said shielded gate electrode to said body regions along sidewalls of said plurality of gate trenches, wherein each of said multiple stepped-epitaxial layers has a uniform doping concentration as grown;

said epitaxial layer in said buffer region has a doping concentration lower than each of said MSE layers in said OCB region;

said SGT MOSFET further comprising an edge termination area having multiple edge trenches, a trench field plate is disposed in each of said multiple edge trenches and insulated from said epitaxial layer by a second insulating film, wherein said each of said multiple edge trenches has a trench width and a trench depth greater than or equal to said each of said plurality of gate trenches in the said active area;

a first electric field reducing region of said first conductivity type surrounding each bottom of said plurality of gate trenches in said active area with a doping concentration lower than said epitaxial layer in said buffer region; and a second electric field reducing region of said second conductivity type surrounding each bottom of said multiple edge trenches in said edge termination area.

17. The SGT MOSFET of claim 16, wherein said MSE layers comprise at least two stepped epitaxial layers of different doping concentrations including a bottom epitaxial layer with a doping concentration D1 and a top epitaxial layer above said bottom epitaxial layer with a doping concentration D2, wherein said D2<said D1.

18. The SGT MOSFET of claim 16, wherein said gate electrode is disposed above said shielded gate electrode.

19. The SGT MOSFET of claim 16, wherein said shielded electrode is disposed in the middle and said gate electrode is disposed surrounding upper portions of said shielded electrode.

20. The SGT MOSFET of claim 16, wherein a mesa width between two adjacent of said plurality of gate trenches is equal to or larger than that between two adjacent of said multiple edge trenches.

\* \* \* \* \*